United States Patent
Yamada

(10) Patent No.: US 9,344,058 B2
(45) Date of Patent: May 17, 2016

(54) RESONATOR ELEMENT HAVING A PAIR OF VIBRATING ARMS WITH WIDE PORTIONS AND ARM PORTIONS

(71) Applicant: SEIKO EPSON CORPORATION, Tokyo (JP)

(72) Inventor: Akinori Yamada, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 137 days.

(21) Appl. No.: 14/202,596

(22) Filed: Mar. 10, 2014

(65) Prior Publication Data

US 2014/0265736 A1 Sep. 18, 2014

(30) Foreign Application Priority Data

Mar. 14, 2013 (JP) ................. 2013-052489

(51) Int. Cl.
*H03H 9/21* (2006.01)
*H03H 9/215* (2006.01)

(52) U.S. Cl.
CPC ..................... *H03H 9/215* (2013.01)

(58) Field of Classification Search
CPC ....................................... H03H 9/215
USPC ......................................... 310/370
See application file for complete search history.

(56) References Cited

U.S. PATENT DOCUMENTS

| | | | |
|---|---|---|---|
| 9,246,471 B2 * | 1/2016 | Yamada | H03H 9/215 |
| 2004/0263027 A1 * | 12/2004 | Kawashima | H03B 5/36 |
| | | | 310/361 |
| 2009/0021120 A1 * | 1/2009 | Dalla Piazza | H03H 9/215 |
| | | | 310/370 |
| 2009/0289530 A1 | 11/2009 | Kawanishi | |
| 2010/0096953 A1 * | 4/2010 | Iwai | H03H 9/21 |
| | | | 310/370 |
| 2011/0018399 A1 * | 1/2011 | Murata | H03H 9/0514 |
| | | | 310/346 |
| 2011/0227672 A1 * | 9/2011 | Yamada | H03H 9/0547 |
| | | | 333/200 |
| 2011/0241496 A1 | 10/2011 | Kawanishi | |
| 2011/0291524 A1 | 12/2011 | Kawase et al. | |
| 2011/0305120 A1 | 12/2011 | Hessler et al. | |

FOREIGN PATENT DOCUMENTS

| | | |
|---|---|---|
| JP | B1-54-37488 | 3/1979 |
| JP | A-1-236808 | 9/1989 |
| JP | A-5-129875 | 5/1993 |
| JP | A-2005-5896 | 1/2005 |
| JP | A-2005-354649 | 12/2005 |
| JP | A-2006-238001 | 9/2006 |
| JP | A-2009-27711 | 2/2009 |
| JP | A-2009-284219 | 12/2009 |

(Continued)

*Primary Examiner* — J. San Martin
(74) *Attorney, Agent, or Firm* — Oliff PLC

(57) ABSTRACT

A resonator element includes a base portion and a pair of vibrating arms that are provided integrally with the base portion, are aligned in an X-axis direction, and extend in a Y-axis direction from the base portion. Each of the vibrating arms includes an arm portion and a wide hammerhead that is located on the free end side of the arm portion and has a greater length in the X-axis direction than the arm portion. Assuming that the length of the vibrating arm in the Y-axis direction is L and the length of the hammerhead in the Y-axis direction is H, the relationship of $1.2\% < H/L < 30.0\%$ is satisfied. Assuming that the length of the arm portion in the X-axis direction is W1 and the length of the hammerhead in the X-axis direction is W2, the relationship of $1.5 \leq W2/W1 \leq 10.0$ is satisfied.

17 Claims, 20 Drawing Sheets

(56) References Cited

FOREIGN PATENT DOCUMENTS

| JP | A-2010-98531 | 4/2010 |
| JP | A-2011-19159 | 1/2011 |
| JP | A-2011-199331 | 10/2011 |
| JP | A-2011-229125 | 11/2011 |
| JP | A-2011-250225 | 12/2011 |
| JP | A-2011-250228 | 12/2011 |
| JP | A-2011-259426 | 12/2011 |
| JP | A-2012-39226 | 2/2012 |
| JP | A-2012-129904 | 7/2012 |
| JP | A-2012-161104 | 8/2012 |

* cited by examiner

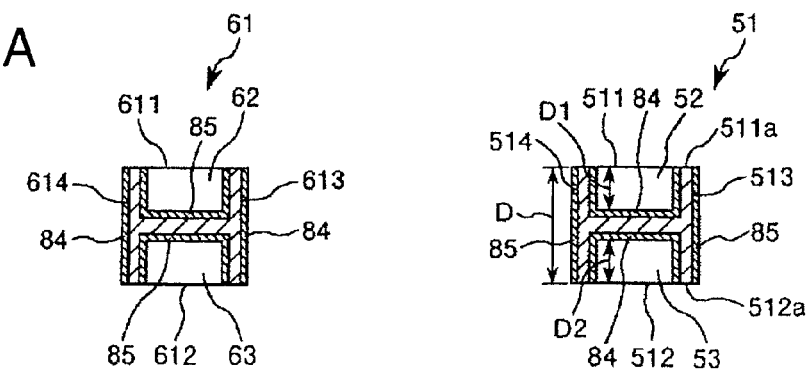
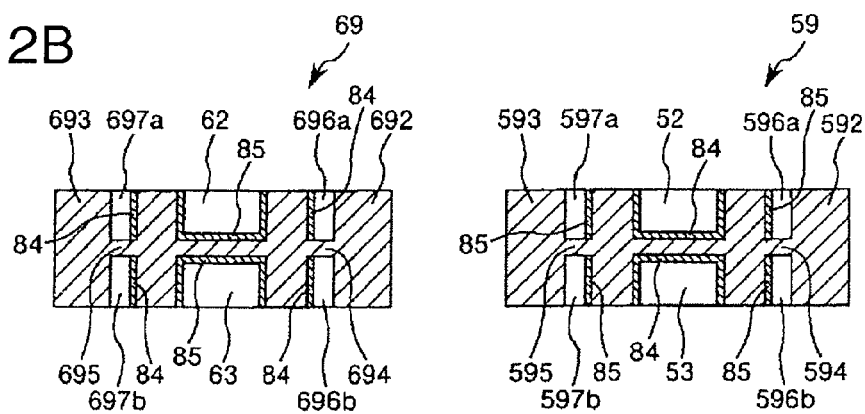
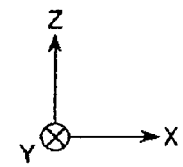

RESONATOR ELEMENT HAVING A PAIR OF VIBRATING ARMS WITH WIDE PORTIONS AND ARM PORTIONS

BACKGROUND

1. Technical Field

The present invention relates to a resonator element, a resonator, an oscillator, an electronic apparatus, and a moving object.

2. Related Art

A resonator element using crystal is known. Such a resonator element has an excellent frequency-temperature characteristic. Accordingly, the resonator element is widely used as a reference frequency source, a signal transmission source, or the like of various electronic apparatuses. The resonator element disclosed in JP-A-2011-19159 is of a tuning fork type, and includes a base portion and a pair of vibrating arms extending from the base portion. In addition, in order to reduce the size and improve the vibration characteristics, a weight portion (wide portion) called a hammerhead is formed at the distal end of each vibrating arm. For example, the length of the hammerhead is set to 30% or more of the total length of the vibrating arm in JP-A-2011-19159, and the length of the hammerhead is set to 35% to 41% of the total length of the vibrating arm in JP-A-2011-199331 and JP-A-2012-129904. However, if the length of the hammerhead is too great for the total length of the vibrating arm as in JP-A-2011-19159, JP-A-2011-199331, and JP-A-2012-129904, when the vibrating arm bends and vibrates, a region where the vibrating arm bends and deforms greatly, that is, a region of an arm portion having a smaller width than the wide portion, which is a region where electrically efficient excitation can be performed, is reduced. As a result, since the CI value of the resonator element becomes high, vibration loss is increased.

SUMMARY

An advantage of some aspects of the invention is to provide a resonator element, which can exhibit excellent vibration characteristics while reducing an increase in the CI value, and a resonator, an oscillator, an electronic apparatus, and a moving object that include the resonator element.

The invention can be implemented as the following application examples.

APPLICATION EXAMPLE 1

This application example is directed to a resonator element including: a base portion; and a pair of vibrating arms that extend in a first direction from the base portion in plan view and are aligned along a second direction crossing the first direction in plan view. Each of the vibrating arms includes an arm portion and a wide portion, which is disposed on a side of the arm portion opposite to the base portion in plan view and which has a length along the second direction that is greater than the arm portion in plan view. Assuming that a length of the vibrating arm along the first direction is L and a length of the wide portion along the first direction is H, a relationship of $1.2\% < H/L < 30.0\%$ is satisfied. Assuming that a length of the arm portion along the second direction is W1 and a length of the wide portion along the second direction is W2, a relationship of $1.5 \leq W2/W1 \leq 10.0$ is satisfied.

With this configuration, it is possible to obtain the resonator element capable of exhibiting excellent vibration characteristics while reducing an increase in the CI value.

APPLICATION EXAMPLE 2

In the resonator element according to the application example, it is preferable that the L and the H satisfy a relationship of $4.6\% < H/L < 22.3\%$.

With this configuration, it is possible to more effectively reduce an increase in the CI value.

APPLICATION EXAMPLE 3

In the resonator element according to the application example, it is preferable that the W1 and the W2 satisfy a relationship of $1.6 \leq W2/W1 \leq 7.0$.

With this configuration, it is possible to more effectively reduce an increase in the CI value.

APPLICATION EXAMPLE 4

In the resonator element according to the application example, it is preferable that a bottomed groove extending along the first direction is provided on a principal surface of the arm portion.

With this configuration, since it is possible to reduce thermoelastic loss, it is possible to exhibit more excellent vibration characteristics.

APPLICATION EXAMPLE 5

In the resonator element according to the application example, it is preferable that the wide portion includes a main body, which is connected to a side of the arm portion opposite to the base portion, and a protruding portion, which extends from the main body toward the base portion of the arm portion so as to be spaced apart from the arm portion in plan view.

With this configuration, it is possible to increase the mass of the wide portion while suppressing the total length of the vibrating arm. In other words, it is possible to make the arm portion long without reducing the mass effect of the wide portion.

APPLICATION EXAMPLE 6

In the resonator element according to the application example, it is preferable that the wide portion further includes a pair of connecting portions that connect the protruding portion and the arm portion to each other and have a length along a third direction perpendicular to the first and second directions that is smaller than the arm portion and the protruding portion.

With this configuration, it is possible to increase the mass of the wide portion while suppressing the total length of the vibrating arm. In other words, it is possible to make the arm portion long without reducing the mass effect of the wide portion.

APPLICATION EXAMPLE 7

In the resonator element according to the application example, it is preferable that the base portion includes a width-decreasing portion, in which a length in the second direction gradually decreases as a distance from the vibrating arm increases, on a side opposite to a side where the vibrating arm extends.

With this configuration, since the vibration of the vibrating arm is offset (reduced and absorbed), it is possible to reduce vibration leakage. Therefore, the resonator element having excellent vibration characteristics is obtained.

APPLICATION EXAMPLE 8

In the resonator element according to the application example, it is preferable that the resonator element includes a support portion that is located between the pair of vibrating arms and extends along the first direction from the base portion.

By fixing the resonator element to the package through the support portion, it is possible to further reduce the vibration leakage.

APPLICATION EXAMPLE 9

In the resonator element according to the application example, it is preferable that the resonator element includes a pair of support arms that are connected to the base portion, extend along the first direction, and are aligned along the second direction with the pair of vibrating arms interposed therebetween in plan view.

By fixing the resonator element to the package through both support arms, it is possible to further reduce the vibration leakage.

APPLICATION EXAMPLE 10

This application example is directed to a resonator including: the resonator element according to the application example described above; and a package in which the resonator element is housed.

With this configuration, it is possible to obtain the resonator with high reliability.

APPLICATION EXAMPLE 11

This application example is directed to an oscillator including the resonator element according to the application example described above and an oscillation circuit electrically connected to the resonator element.

With this configuration, it is possible to obtain the oscillator with high reliability.

APPLICATION EXAMPLE 12

This application example is directed to an electronic apparatus including the resonator element according to the application example described above.

With this configuration, it is possible to obtain the electronic apparatus with high reliability.

APPLICATION EXAMPLE 13

This application example is directed to a moving object including the resonator element according to the application example described above.

With this configuration, it is possible to obtain the moving object with high reliability.

BRIEF DESCRIPTION OF THE DRAWINGS

The invention will be described with reference to the accompanying drawings, wherein like numbers reference like elements.

FIG. 2A is a cross-sectional view taken along the line A-A of FIG. 1, and FIG. 2B is a cross-sectional view taken along the line B-B of FIG. 1.

DESCRIPTION OF EXEMPLARY EMBODIMENTS

Hereinafter, a resonator element, a resonator, an oscillator, an electronic apparatus, and a moving object of the invention will be described in detail by way of preferred embodiments shown in the diagrams.

1. Resonator Element

First, the resonator element according to the invention will be described.

First Embodiment

Figure 1:
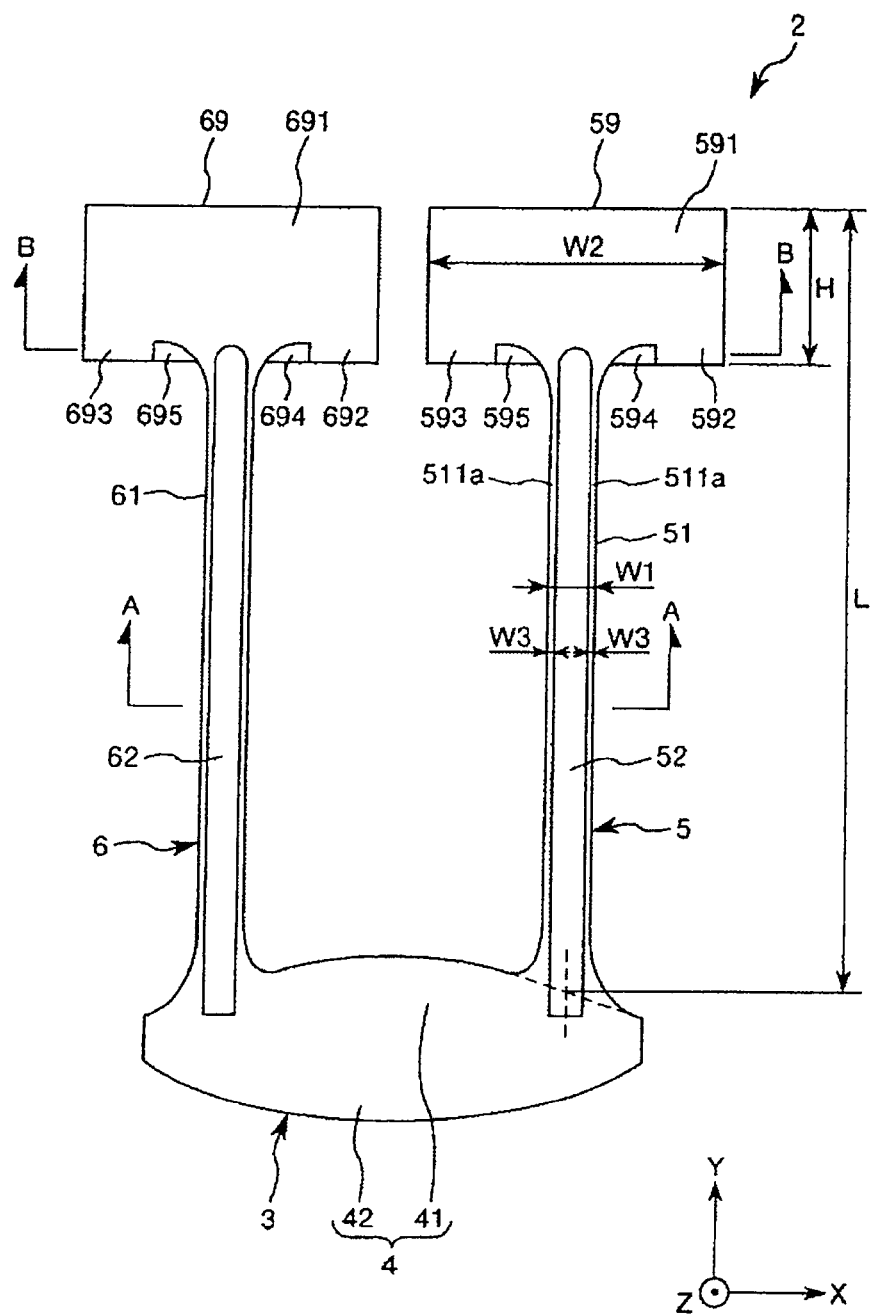
FIG. 1 is a plan view of a resonator element according to a first embodiment of the invention.
Figures 3A, 3B:
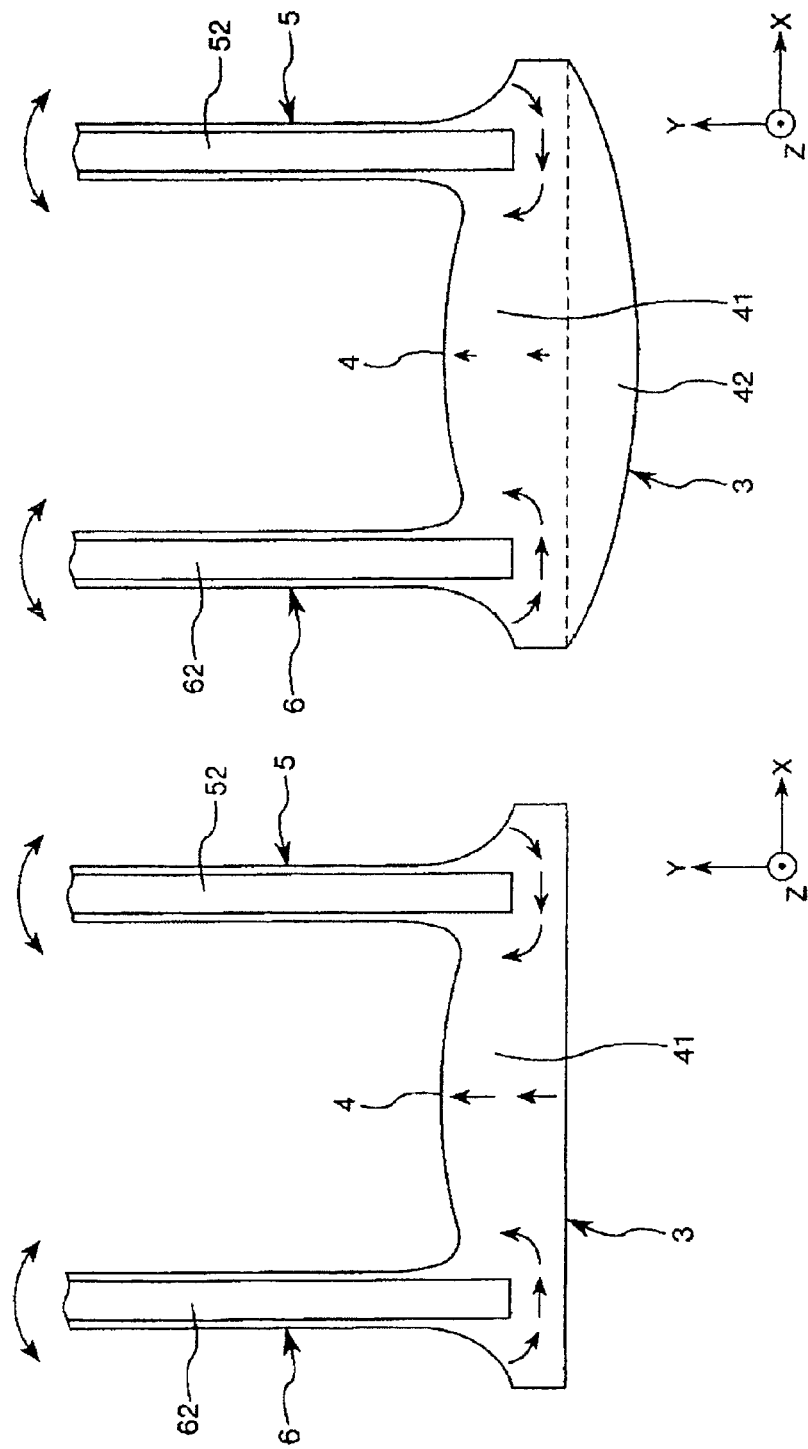
FIGS. 3A and 3B are plan views illustrating the principle of vibration leakage reduction.
Figure 4:
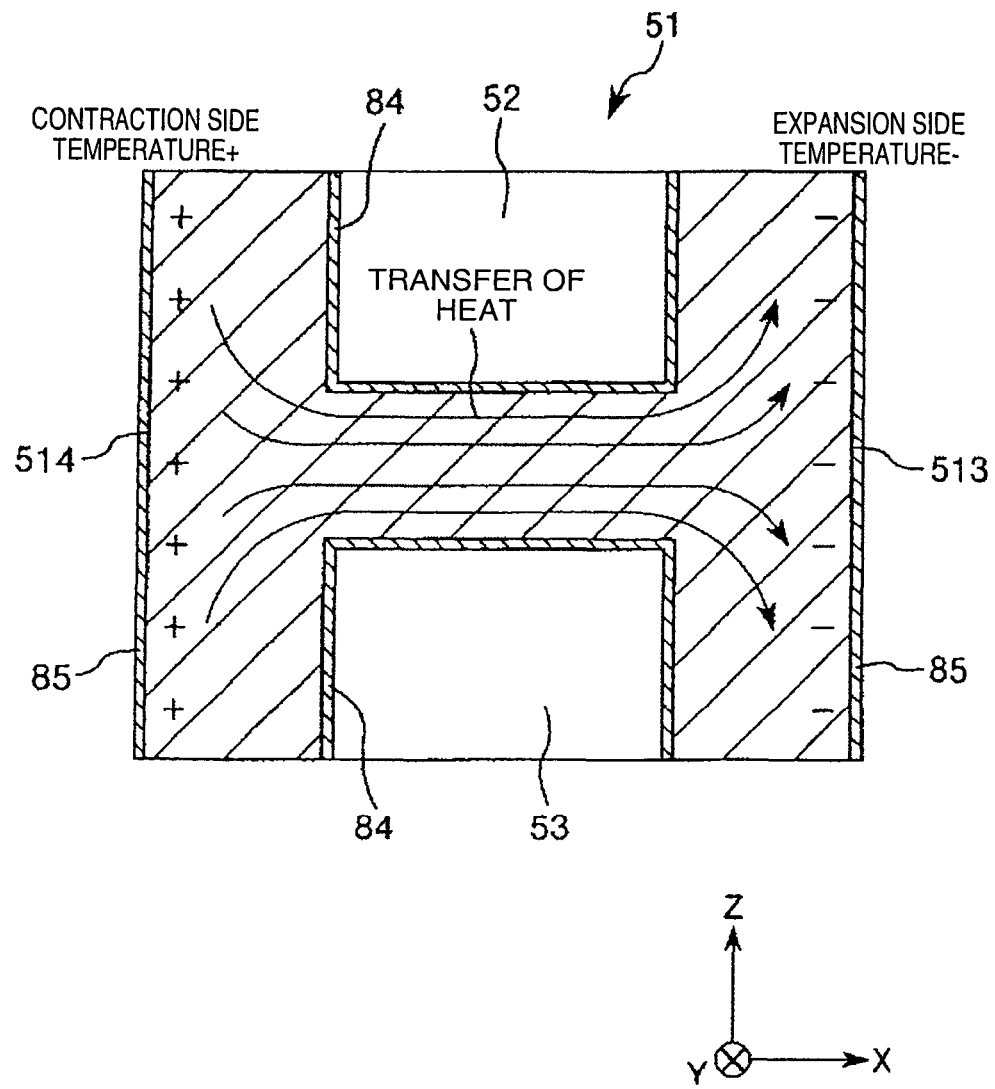
FIG. 4 is a cross-sectional view of a vibrating arm illustrating heat conduction when the vibrating arm bends and vibrates.
Figure 5:
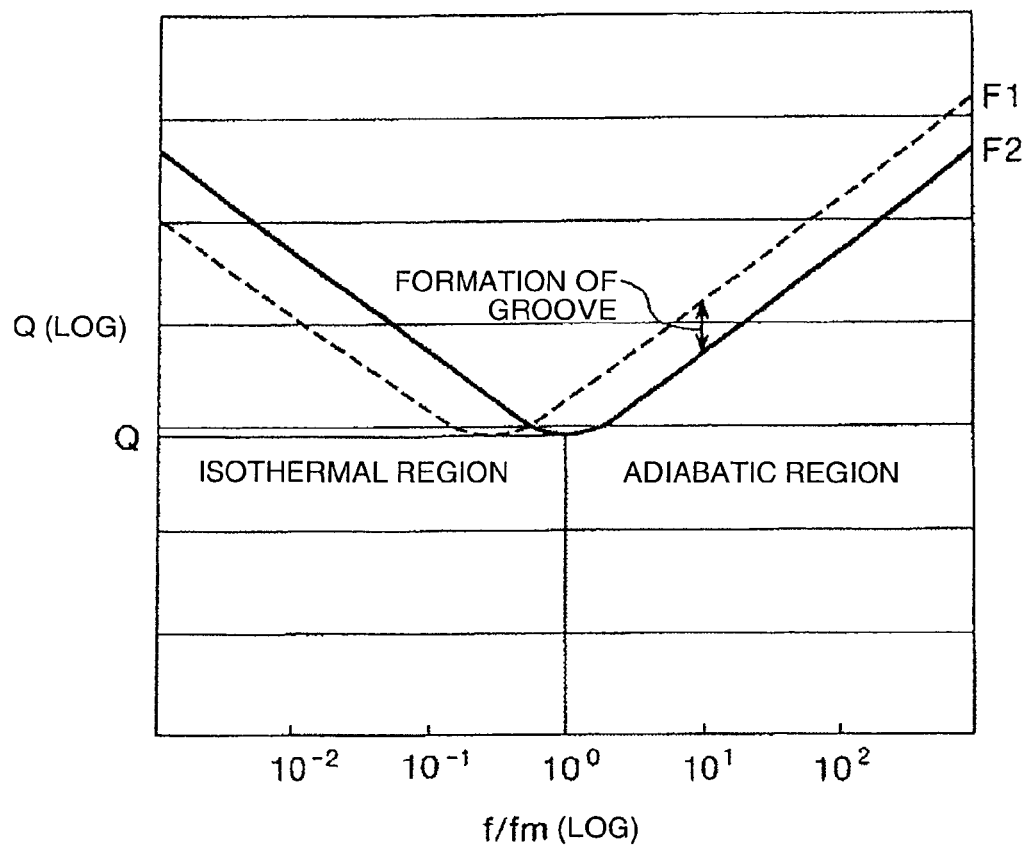
FIG. 5 is a graph showing the relationship between the Q value and f/fm.
Figure 6:
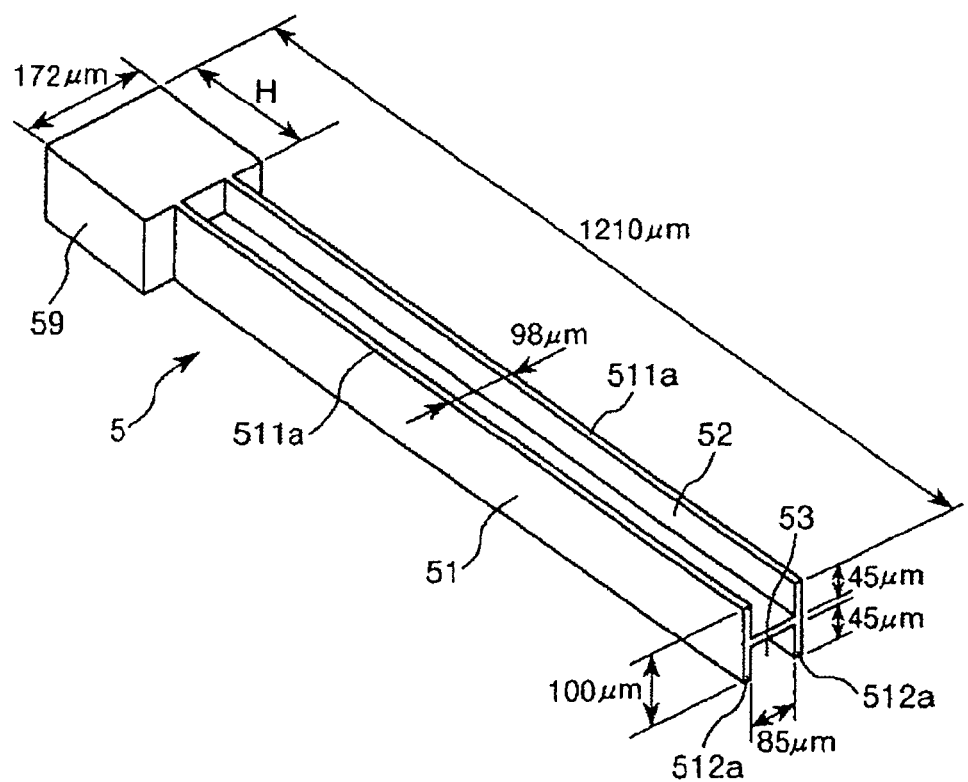
FIG. 6 is a perspective view showing the shape and the size of a vibrating arm used in the simulation.
Figure 7:
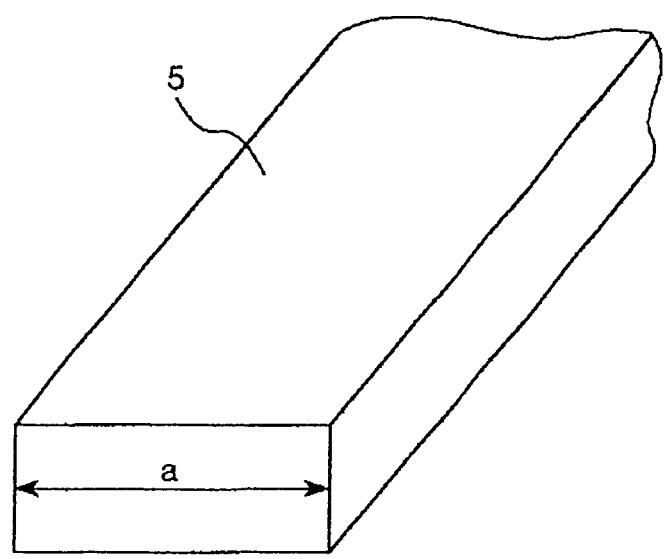
FIG. 7 is a perspective view illustrating the effective width.
Figure 8A:
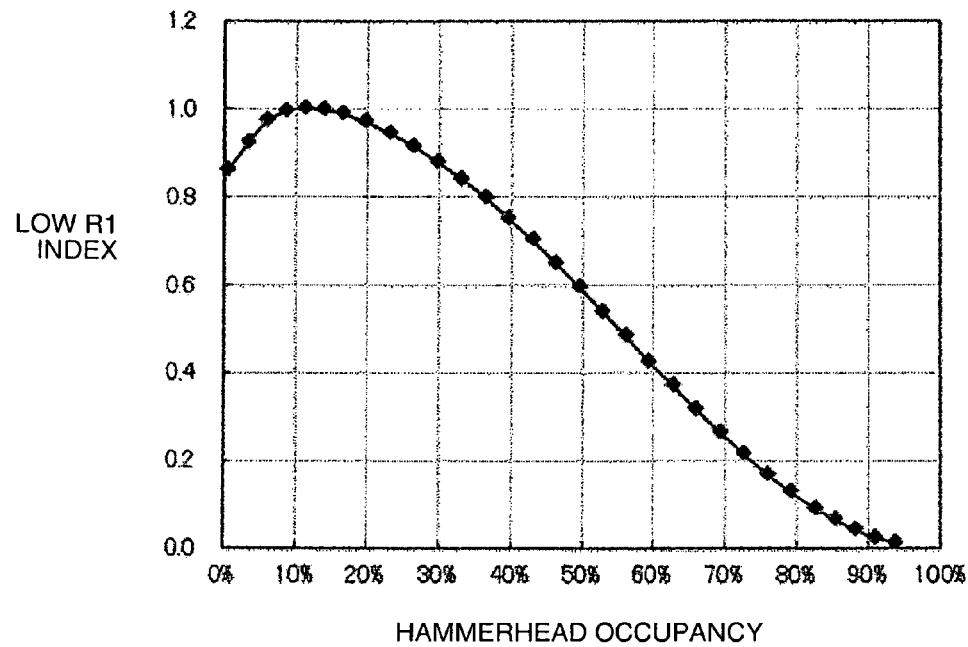
FIGS. 8A and 8B are graphs showing the relationship between the hammerhead occupancy and the low R1 index.
Figure 8B:
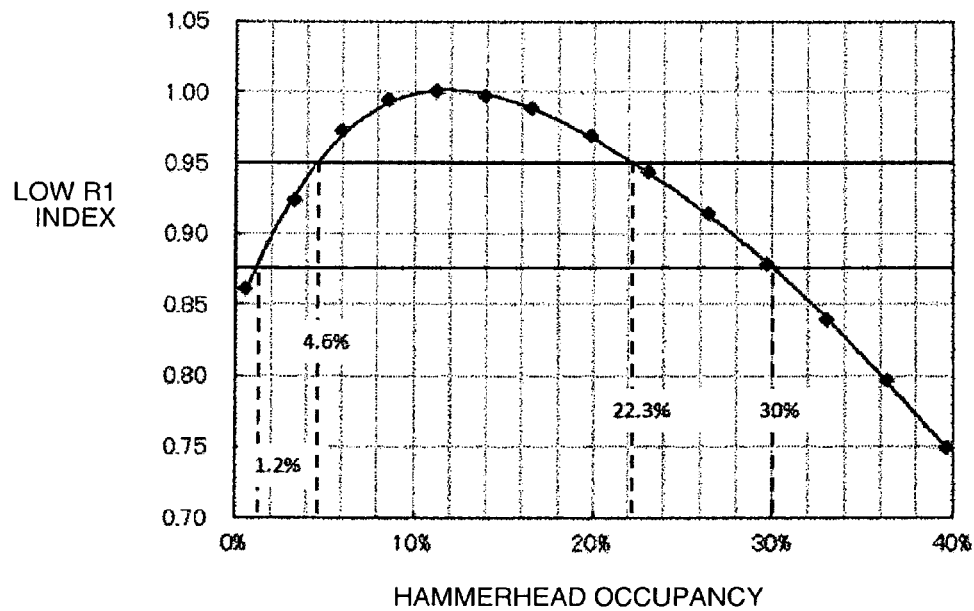

FIG. 1 is a plan view of a resonator element according to a first embodiment of the invention, FIG. 2A is a cross-sectional view taken along the line A-A of FIG. 1, FIG. 2B is a cross-sectional view taken along the line B-B of FIG. 1, FIGS. 3A and 3B are plan views illustrating the principle of vibration leakage reduction, FIG. 4 is a cross-sectional view of a vibrating arm illustrating heat conduction when the vibrating arm bends and vibrates, FIG. 5 is a graph showing the relationship between the Q value and f/fm, FIG. 6 is a perspective view showing the shape and size of a vibrating arm used in the simulation, FIG. 7 is a perspective view illustrating the effective width a, and FIGS. 8A and 8B are graphs showing the relationship between the hammerhead occupancy and the low R1 index. In addition, as shown in FIG. 1, three axes perpendicular to each other are assumed to be an X axis (electrical axis of quartz crystal), a Y axis (mechanical axis of quartz crystal), and a Z axis (optical axis of quartz crystal) hereinbelow for convenience of explanation.

As shown in FIGS. 1, 2A, and 2B, a resonator element 2 includes a quartz crystal substrate 3 and first and second driving electrodes 84 and 85 formed on the quartz crystal substrate 3.

The quartz crystal substrate 3 is formed of a Z-cut quartz crystal plate. The Z-cut quartz crystal plate is a quartz crystal substrate having a Z axis as its thickness direction. In addition, it is preferable that the Z axis match the thickness direction of the quartz crystal substrate 3. However, from the viewpoint of reducing the frequency temperature change near the room temperature, the Z axis may be inclined slightly (for example, less than about 15°) with respect to the thickness direction.

That is, in a Cartesian coordinate system having an X axis as an electrical axis, a Y axis as a mechanical axis, and a Z axis as an optical axis of the crystal, assuming that an axis obtained by inclining the Z axis so that a +Z side rotates in a −Y direction of the Y axis with the X axis as a rotation axis is a Z' axis and an axis obtained by inclining the Y axis so that a +Y side rotates in a +Z direction of the Z axis with the X axis as a rotation axis is a Y' axis, the quartz crystal substrate 3 in which a direction along the Z' axis is the thickness direction and a surface including the X axis and the Y' axis is the principal surface is obtained.

In addition, although the thickness D of the quartz crystal substrate 3 is not limited in particular, it is preferable that the thickness D of the quartz crystal substrate 3 be less than 70 μm. By setting such a numerical range, for example, when the quartz crystal substrate 3 is formed by wet etching (patterning), it is possible to effectively prevent that an unnecessary portion (portion to be removed) remains in a boundary of a vibrating arm 5 and a base portion 4, a boundary of an arm portion 51 and a hammerhead 59 to be described later, and the like. Therefore, it is possible to obtain the resonator element 2 capable of effectively reducing vibration leakage. From a different point of view, it is preferable that the thickness D be equal to or greater than about 70 μm and equal to or less than about 300 μm. More preferably, it is preferable that the thickness D be equal to or greater than about 100 μm and equal to or less than about 150 μm. By setting such a numerical range, the first and second driving electrodes 84 and 85 can be widely formed on the side surfaces (side surfaces 513, 514, 613, and 614 to be described later) of the quartz crystal substrate 3. Accordingly, it is possible to lower the CI value.

The quartz crystal substrate 3 includes the base portion 4 and a pair of vibrating arms 5 and 6.

The base portion 4 has an approximate plate shape that spreads on the XY plane and has a thickness in the Z-axis direction. The base portion 4 includes a portion (main body 41), which supports and connects the vibrating arms 5 and 6, and a width-decreasing portion 42 to reduce vibration leakage.

The width-decreasing portion 42 is provided on the proximal side (side opposite to a side on which the vibrating arms 5 and 6 extend) of the main body 41. In addition, the width (length along the X-axis direction) of the width-decreasing portion 42 gradually decreases as a distance from each of the vibrating arms 5 and 6 increases. Due to the width-decreasing portion 42, it is possible to effectively reduce the vibration leakage of the resonator element 2.

This will be specifically described as follows. In addition, in order to simplify the explanation, it is assumed that the shape of the resonator element 2 is symmetrical with respect to a predetermined axis parallel to the Y axis.

First, as shown in FIG. 3A, a case where the width-decreasing portion 42 is not provided will be described. When the vibrating arms 5 and 6 bend and deform so as to be spaced apart from each other, displacement close to the clockwise rotational movement occurs as indicated by the arrow in the main body 41 in the vicinity of a portion to which the vibrating arm 5 is connected, and displacement close to the counterclockwise rotational movement occurs as indicated by the arrow in the main body 41 in the vicinity of a portion to which the vibrating arm 6 is connected (strictly speaking, this movement cannot be said to be rotational movement; accordingly, this is expressed as "being close to the rotational movement" for convenience). Since X-axis-direction components of these displacements are in the directions opposite to each other, the X-axis-direction components are offset in the X-axis-direction middle portion of the main body 41, and displacement in the +Y-axis direction remains (strictly speaking, displacement in the Z-axis direction also remains; however, the displacement in the Z-axis direction will be omitted herein). That is, the main body 41 bends and deforms such that the X-axis-direction middle portion is displaced in the +Y-axis direction. When an adhesive is formed in the Y-axis-direction middle portion of the main body 41 having the above-described displacement in the +Y-axis direction and the main body 41 is fixed to the package through the adhesive, elastic energy due to the displacement in the +Y-axis direction leaks to the outside through the adhesive. This is the loss of vibration leakage, causing the degradation of the Q value. As a result, the CI value is degraded.

In contrast, as shown in FIG. 3B, when the width-decreasing portion 42 is provided, the width-decreasing portion 42 has an arch-shaped (curved) contour. For this reason, the displacements close to the rotational movement described above are applied to each other in the width-decreasing portion 42. That is, in the X-axis-direction middle portion of the width-decreasing portion 42, displacements in the X-axis direction are offset as in the X-axis-direction middle portion of the main body 41, and the displacement in the Y-axis direction is also suppressed. In addition, since the contour of the width-decreasing portion 42 has an arch shape, the displacement in the +Y-axis direction that is about to occur in the main body 41 is also suppressed. As a result, the +Y-axis-direction displacement of the X-axis-direction middle portion of the base portion 4 when the width-decreasing portion 42 is provided becomes much smaller than that when the width-decreasing portion 42 is not provided. That is, it is possible to obtain a resonator element having small vibration leakage.

In addition, although the contour of the width-decreasing portion 42 has an arch shape herein, the shape of the contour of the width-decreasing portion 42 is not limited thereto as long as the operation described above can be realized. For example, it is possible to use a width-decreasing portion having a contour that is formed stepwise by a plurality of straight lines.

The vibrating arms 5 and 6 are aligned in the X-axis direction (second direction), and extend in the Y-axis direction (first direction) from the upper end of the base portion 4 so as to be parallel to each other. Each of the vibrating arms 5 and 6 has a longitudinal shape. The base end of each of the vibrating arms 5 and 6 is a fixed end, and the distal end is a free end. In addition, the vibrating arms 5 and 6 include arm portions 51 and 61 and hammerheads (wide portions) 59 and 69 provided at the distal ends of the arm portions 51 and 61.

The arm portion 51 has a pair of principal surfaces 511 and 512, which are the XY plane, and a pair of side surfaces 513 and 514, which are the YZ plane and connect the pair of principal surfaces 511 and 512 to each other. In addition, the arm portion 51 includes a bottomed groove 52 opened to the principal surface 511 and a bottomed groove 53 opened to the principal surface 512. Each of the grooves 52 and 53 extends in the Y-axis direction, and its distal end extends up to the hammerhead 59 and its base end extends up to the base portion 4.

Thus, since it is possible to reduce thermoelastic loss by forming the grooves 52 and 53 in the vibrating arm 5, it is possible to exhibit excellent vibration characteristics (to be described in detail later). Since the length of each of the grooves 52 and 53 is not limited, the distal end of each of the grooves 52 and 53 may not need to extend to the hammerhead 59. In particular, when the distal end of each of the grooves 52 and 53 extends to the hammerhead 59 as in the present embodiment, a stress concentration occurring near the distal end of each groove is reduced. Therefore, a possibility of chipping or breakage that occurs when an impact is applied is reduced. In addition, since the base end of each of the grooves 52 and 53 extends to the base portion 4, the stress concentration in the boundary thereof is reduced. Therefore, a possibility of chipping or breakage that occurs when an impact is applied is reduced.

Although the depth of each of the grooves 52 and 53 is not limited in particular, it is preferable that the relationship of $60\% \leq (D1+D2)/D \leq 95\%$ be satisfied assuming that the depth of the groove 52 is D1 and the depth of the groove 53 is D2 (in the present embodiment, D1=D2). Since a heat transfer path becomes long by satisfying such a relationship, it is possible to more effectively reduce thermoelastic loss in an adiabatic region (to be described in detail later).

In addition, it is preferable to form the grooves 52 and 53 by adjusting the positions of the grooves 52 and 53 in the X-axis direction with respect to the position of the vibrating arm 5 so that the cross-sectional center of gravity of the vibrating arm 5 matches the center of the cross-sectional shape of the vibrating arm 5. In this case, since it is possible to reduce unnecessary vibration (specifically, oblique vibration having an out-of-plane component) of the vibrating arm 5, it is possible to reduce vibration leakage. In addition, in this case, since it is also possible to reduce driving for unnecessary vibration, a driving region is relatively increased. Therefore, it is possible to reduce the CI value.

In addition, assuming that the widths (lengths in the X-axis direction) of bank portions (principal surfaces aligned with the groove 52 along the width direction perpendicular to the longitudinal direction of the vibrating arm interposed therebetween) 511a, which are located on both sides of the groove 52 of the principal surface 511 in the X-axis direction, and bank portions 512a, which are located on both sides of the groove 53 of the principal surface 512 in the X-axis direction, are W3, it is preferable to satisfy the relationship of $0 \, \mu m < W3 \leq 20 \, \mu m$. In this case, the IC value of the resonator element 2 becomes sufficiently low. In the numerical range described above, it is preferable to satisfy the relationship of $5 \, \mu m < W3 \leq 9 \, \mu m$. In this case, in addition to the effects described above, it is possible to reduce thermoelastic loss. In addition, it is also preferable to satisfy the relationship of $0 \, \mu m < W3 \leq 5 \, \mu m$. In this case, it is possible to further lower the CI value of the resonator element 2.

The hammerhead 59 has an approximately rectangular shape in XY plan view. In addition, the hammerhead 59 includes a main body 591 connected to the distal end of the arm portion 51, protruding portions 592 and 593 that protrude toward the proximal side of the vibrating arm 5 from the main body 591, and thin portions (connecting portions) 594 and 595 formed between the protruding portions 592 and 593 and the arm portion 51.

The main body 591 has a width (length in the X-axis direction) greater than the arm portion 51, and protrudes to both sides in the X-axis direction from the arm portion 51. A pair of protruding portions 592 and 593 are located on both sides in the X-axis direction with the arm portion 51 interposed therebetween. Each of the protruding portions 592 and 593 is spaced apart from the arm portion 51 in the X-axis direction, and protrudes from the proximal-side outer edge of the main body 591 to the proximal side of the vibrating arm 5.

The thin portion 594 is provided between the protruding portion 592 and the arm portion 51 so as to connect the protruding portion 592 and the arm portion 51 to each other, and the thin portion 594 is thinner than the protruding portion 592 and the arm portion 51 (length of the thin portion 594 in the Z-axis direction is shorter than those of the protruding portion 592 and the arm portion 51). Therefore, a bottomed groove 596a opened to one principal surface of the hammerhead 59 and a bottomed groove 596b opened to another principal surface of the hammerhead 59 are formed between the arm portion 51 and the protruding portion 592. Similarly, the thin portion 595 is provided between the protruding portion 593 and the arm portion 51 so as to connect the protruding portion 593 and the arm portion 51 to each other, and the thin portion 595 is thinner than the protruding portion 593 and the arm portion 51. Therefore, a bottomed groove 597a opened to one principal surface of the hammerhead 59 and a bottomed groove 597b opened to another principal surface of the hammerhead 59 are formed between the arm portion 51 and the protruding portion 593.

By forming the hammerhead 59 in such a configuration, it is possible to increase the mass of the hammerhead 59 while suppressing the total length L of the vibrating arm 5. In other words, when the total length L of the vibrating arm 5 is fixed, it is possible to ensure that the arm portion 51 is as long as possible without reducing the mass effect of the hammerhead 59. Therefore, it is possible to increase the width (length in the X-axis direction) of the vibrating arm 5 in order to obtain a desired resonance frequency (for example, 32.768 kHz). As a result, since a heat transfer path to be described later becomes long, thermoelastic loss is reduced and the Q value is improved.

In addition, the center of the hammerhead 59 in the X-axis direction may be slightly shifted from the center of the vibrating arm 5 in the X-axis direction. In this case, since it is possible to reduce the vibration of the base portion 4 in the Z-axis direction that occurs due to twisting of the vibrating arm 5 when the vibrating arm 5 bends and vibrates, it is possible to suppress vibration leakage.

Until now, the vibrating arm 5 has been described. The vibrating arm 6 has the same configuration as the vibrating arm 5. That is, the arm portion 61 has a pair of principal surfaces 611 and 612, which are the XY plane, and a pair of side surfaces 613 and 614, which are the YZ plane and connect the pair of principal surfaces 611 and 612 to each other. In addition, the arm portion 61 includes a bottomed groove 62 opened to the principal surface 611 and a bottomed groove 63 opened to the principal surface 612. Each of the grooves 62 and 63 extends in the Y-axis direction, and its distal end extends up to the hammerhead 69 and its base end extends up to the base portion 4.

The hammerhead 69 has an approximately rectangular shape in XY plan view. In addition, the hammerhead 69 includes a main body 691 connected to the distal end of the arm portion 61, protruding portions 692 and 693 that protrude toward the proximal side of the vibrating arm 6 from the main body 691, and thin portions 694 and 695 formed between the protruding portions 692 and 693 and the arm portion 61.

The main body 691 has a width (length in the X-axis direction) greater than the arm portion 61, and protrudes to both sides in the X-axis direction from the arm portion 61. A pair of the protruding portions 692 and 693 are located on both sides in the X-axis direction with the arm portion 61 interposed therebetween. Each of the protruding portions 692 and 693 is spaced apart from the arm portion 61 in the X-axis direction, and protrudes from the proximal-side outer edge of the main body 691 to the proximal side of the vibrating arm 6. The thin portion 694 is provided between the protruding portion 692 and the arm portion 61 so as to connect the protruding portion 692 and the arm portion 61 to each other, and the thin portion 694 is thinner than the protruding portion 692 and the arm portion 61. Therefore, a bottomed groove 696a opened to one principal surface of the hammerhead 69 and a bottomed groove 696b opened to another principal surface of the hammerhead 69 are formed between the arm portion 61 and the protruding portion 692. Similarly, the thin portion 695 is provided between the protruding portion 693 and the arm portion 61 so as to connect the protruding portion 693 and the arm portion 61 to each other, and the thin portion 695 is thinner than the protruding portion 693 and the arm portion 61. Therefore, a bottomed groove 697a opened to one principal surface of the hammerhead 69 and a bottomed groove 697b opened to another principal surface of the hammerhead 69 are formed between the arm portion 61 and the protruding portion 693.

By forming the hammerhead 69 in such a configuration, it is possible to increase the mass of the hammerhead 69 while suppressing the total length L of the vibrating arm 6. In other words, when the total length L of the vibrating arm 6 is fixed, it is possible to ensure that the arm portion 61 is as long as possible without reducing the mass effect of the hammerhead 69.

In addition, the center of the hammerhead 69 in the X-axis direction may be slightly shifted from the center of the vibrating arm 5 in the X-axis direction. In this case, since it is possible to reduce the vibration of the base portion 4 in the Z-axis direction that occurs due to twisting of the vibrating arm 5 when the vibrating arm 5 bends and vibrates, it is possible to suppress vibration leakage.

As shown in FIGS. 2A and 2B, a pair of first driving electrodes 84 and a pair of second driving electrodes 85 are formed in the vibrating arm 5. Specifically, one of the first driving electrodes 84 is formed on the inner surface (side surface) of the groove 52, and the other first driving electrode 84 is formed on the inner surface (side surface) of the groove 53. In addition, one of the second driving electrodes 85 is formed on the side surface 513, and the other second driving electrode 85 is formed on the side surface 514. In addition, when the first driving electrode 84 is not formed so as to extend to a region surrounded by the hammerhead 59 or/and the second driving electrode 85 does not extend from the side surface 513 to the inner surface (side surface on the arm portion 51 side) of the grooves 596a and 596b, the equivalent series capacitance C1 can be reduced. Accordingly, since the absolute value of the load capacity sensitivity S (=C1/(2×(C0+CL)$^2$) is reduced, it is possible to obtain the stable resonance characteristics. In addition, the load capacity sensitivity S is an index indicating a change in the resonance frequency with respect to a change in the load capacity, C0 is an electrostatic capacitance, and CL is a load capacity.

In addition, one second driving electrode 85 may extend from the side surface 513 to the inner surface (side surface on the arm portion 51 side) of the grooves 596a and 596b. Similarly, the other second driving electrode 85 may extend from the side surface 514 to the inner surface (side surface on the arm portion 51 side) of the grooves 597a and 597b. In this case, it is possible to make a region where the electric field is applied wider.

Similarly, a pair of first driving electrodes 84 and a pair of second driving electrodes 85 are also formed in the vibrating arm 6. Specifically, one of the first driving electrodes 84 is formed on the side surface 613, and the other first driving electrodes 84 is formed on the side surface 614. In addition, one of the second driving electrodes 85 is formed on the inner surface (side surface) of the groove 62, and the other second driving electrodes 85 is formed on the inner surface (side surface) of the groove 63. In addition, one first driving electrode 84 may extend from the side surface 613 to the inner surface (side surface on the arm portion 61 side) of the grooves 696a and 696b. Similarly, the other first driving electrode 84 may extend from the side surface 614 to the inner surface (side surface on the arm portion 61 side) of the grooves 697a and 697b. In this case, it is possible to make a region where the electric field is applied wider.

When an AC voltage is applied between the first and second driving electrodes 84 and 85, the vibrating arms 5 and vibrate at a predetermined frequency in the in-plane direction (XY plane direction) so as to repeat being close to and away from each other.

Materials of the first and second driving electrodes 84 and 85 are not limited in particular, and it is possible to use metal materials, such as gold (Au), a gold alloy, platinum (Pt), aluminum (Al), an aluminum alloy, silver (Ag), a silver alloy, chromium (Cr), a chromium alloy, nickel (Ni), a nickel alloy, copper (Cu), molybdenum (Mo), niobium (Nb), tungsten (W), iron (Fe), titanium (Ti), cobalt (Co), zinc (Zn), and zirconium (Zr), and conductive materials, such as indium tin oxide (ITO).

As a specific configuration of the first and second driving electrodes 84 and 85, it is possible to adopt a configuration in which an Au layer of 700 Å or less is formed on a Cr layer of 700 Å or less, for example. In particular, in the case of Cr or Au, thermoelastic loss is large. Therefore, the Cr layer and the Au layer are preferably equal to or less than 100 Å. In addition, since Ni has a thermal expansion coefficient close to the thermal expansion coefficient of the crystal, thermal stress due to electrodes is reduced by forming a Ni layer as a base layer in place of the Cr layer. In this case, it is possible to obtain a resonator element with good long-term reliability (aging characteristics).

As described above, in the resonator element 2, it is possible to reduce thermoelastic loss by forming the grooves 52, 53, 62, and 63 in the vibrating arms 5 and 6. Hereinafter, this will be specifically described with the vibrating arm 5 as an example.

As described above, the vibrating arm 5 bends and vibrates in the in-plane direction by applying an AC voltage between the first and second driving electrodes 84 and 85. As shown in FIG. 4, when the vibrating arm 5 bends and vibrates, the side surface 514 expands if the side surface 513 of the arm portion 51 contracts. In contrast, if the side surface 513 expands, the side surface 514 contracts. When the vibrating arm 5 does not cause the Gough-Joule effect (when energy elasticity is dominant over the entropy elasticity), the temperature on the contracted surface side of the side surfaces 513 and 514 rises, and the temperature on the expanded surface side drops. For this reason, a temperature difference occurs between the side surfaces 513 and 514 (that is, inside the arm portion 51). Due to heat conduction resulting from such a temperature difference, loss of vibration energy occurs. As a result, the Q value of the resonator element 2 is reduced. Such a reduction in the Q value is also called a thermoelastic effect, and the loss of energy due to the thermoelastic effect is also called thermoelastic loss.

In a resonator element that vibrates in a bending vibration mode and has the same configuration as the resonator element 2, when the bending vibration frequency (mechanical bending vibration frequency) f of the vibrating arm 5 changes, the Q value is minimized when the bending vibration frequency of the vibrating arm 5 matches a thermal relaxation frequency fm. The thermal relaxation frequency fm can be calculated by fm=1/(2π) (where π is the circumference ratio, and τ is relaxation time required for the temperature difference to become $e^{-1}$ times due to heat conduction, assuming that e is Napier's constant).

In addition, assuming that the thermal relaxation frequency of the flat plate structure (structure having a rectangular cross-sectional shape) is fm0, fm0 can be calculated by the following expression.

$$fm0 = \pi k/(2\rho C p a^2) \quad (1)$$

In addition, n is the circumference ratio, k is the thermal conductivity in the vibration direction of the vibrating arm 5, ρ is the mass density of the vibrating arm 5, Cp is the heat capacity of the vibrating arm 5, and a is the width of the vibrating arm 5 in the vibration direction. When the constant of the material itself (that is, crystal) of the vibrating arm 5 is input to the thermal conductivity k, the mass density ρ, and the heat capacity Cp in Expression (1), the calculated thermal relaxation frequency fm0 is a value when the grooves 52 and 53 are not provided in the vibrating arm 5.

In the vibrating arm 5, the grooves 52 and 53 are formed so as to be located between the side surfaces 513 and 514. For this reason, since a heat transfer path for balancing the temperature by eliminating the temperature difference between the side surfaces 513 and 514, which is caused when the vibrating arm 5 bends and vibrates, by heat conduction is formed so as to bypass the grooves 52 and 53, the heat transfer path is longer than the straight-line distance (shortest distance) between the side surfaces 513 and 514. Therefore, compared with a case where the grooves 52 and 53 are not provided in the vibrating arm 5, the relaxation time τ becomes long, and the thermal relaxation frequency fm becomes low.

FIG. 5 is a graph showing the f/fm dependence of the Q value of the resonator element in the bending vibration mode. In FIG. 5, a curve F1 indicated by the dotted line shows a case where a groove is formed in a vibrating arm as in the resonator element 2 (case where the cross-sectional shape of the vibrating arm is an H shape), and a curve F2 indicated by the solid line shows a case where no groove is formed in a vibrating arm (case where the cross-sectional shape of a connecting arm is a rectangle). As shown in FIG. 5, the shapes of the curves F1 and F2 are not changed, but the curve F1 is shifted in a frequency decrease direction with respect to the curve F2 with a reduction in the thermal relaxation frequency fm as described above. Accordingly, assuming that the thermal relaxation frequency when a groove is formed in a vibrating arm as in the resonator element 2 is fm1, the Q value of the resonator element in which a groove is formed in the vibrating arm is always higher than the Q value of the resonator element in which no groove is formed in the vibrating arm by satisfying the following Expression (2).

$$f \neq \sqrt{f_{m0} f_{m1}} \quad (2)$$

In addition, it is possible to obtain a higher Q value when being limited to the relationship of f/fm0>1.

In addition, in FIG. 5, the region of f/fm<1 is also called an isothermal region. In this isothermal region, the Q value increases as f/fm decreases. This is because it is difficult for the above-described temperature difference in the vibrating arm to occur as the mechanical frequency of the vibrating arm becomes low (vibration of the vibrating arm becomes slow). Accordingly, in a limit when f/fm approaches 0 (zero) infinitely, an isothermal quasi-static operation is realized, and thermoelastic loss approaches 0 (zero) infinitely. Meanwhile, the region of f/fm>1 is also called an adiabatic region. In this adiabatic region, the Q value increases as f/fm increases. This is because the switching of temperature rise and temperature effect of each side surface becomes fast as the mechanical frequency of the vibrating arm becomes high, and accordingly, there is no time in which the above-described heat conduction occurs. Accordingly, in a limit when f/fm is increased infinitely, an adiabatic operation is realized, and thermoelastic loss approaches 0 (zero) infinitely. From this, it can be rephrased that f/fm is in the adiabatic region if the relationship of f/fm>1 is satisfied.

Next, the relationship between the total length of the vibrating arms 5 and 6 and the length and width of the hammerheads 59 and 69 will be described. Since the vibrating arms 5 and 6 have the same configuration, the vibrating arm will be described as a representative vibrating arm hereinafter, and explanation of the vibrating arm 6 will be omitted.

As shown in FIG. 1, assuming that the total length (length in the Y-axis direction) of the vibrating arm 5 is L and the length (length in the Y-axis direction) of the hammerhead 59 is H, the vibrating arm 5 satisfies the relationship of 1.2%<H/L<30.0%. If this relationship is satisfied, it is preferable that the relationship of 4.6%<H/L<22.3% be further satisfied, even though the relationship is not limited in particular. When such a relationship is satisfied, the CI value of the resonator element 2 can be kept low. Therefore, since the vibration loss is small, the resonator element 2 having excellent vibration characteristics is obtained. Here, in the present embodiment, the base end of the vibrating arm 5 is set in a position of the line segment, which connects a place where the side surface 514 is connected to the base portion 4 and a place where the side surface 513 is connected to the base portion 4, in the middle of the width (length in the X-axis direction) of the vibrating arm 5.

In addition, assuming that the width (length in the X-axis direction) of the arm portion 51 is W1 and the width (length in the X-axis direction) of the hammerhead 59 is W2, the vibrating arm 5 satisfies the relationship of 1.5≤W2/W1≤10.0. If this relationship is satisfied, it is preferable that the relationship of 1.6≤W2/W1≤7.0 be further satisfied, even though the relationship is not limited in particular. By satisfying such a relationship, it is possible to ensure the great width of the hammerhead 59. Therefore, even if the length H of the hammerhead 59 is relatively small as described above (even if the length H of the hammerhead 59 is less than 30% of L), it is possible to sufficiently exhibit the mass effect of the hammerhead 59. Therefore, by satisfying the relationship of 1.5≤W2/W1≤10.0, the total length L of the vibrating arm 5 is reduced. As a result, it is possible to reduce the size of the resonator element 2.

Thus, the vibrating arm 5 satisfies the relationship of 1.2%<H/L<30.0% and the relationship of 1.5≤W2/W1≤10.0. By the synergetic effect of these two relationships, the resonator element 2 that is small and has a sufficiently reduced CI value is obtained.

In addition, by setting L≤2 mm, preferably, L≤1 mm, it is possible to obtain a small resonator element used in an oscillator that is mounted in a portable music device, an IC card, and the like. In addition, by setting W1≤100 µm, preferably, W1≤50 µm, it is also possible to obtain a resonator element, which resonates at a low frequency and which is used in an oscillation circuit for realizing low power consumption, in the range of L. In addition, in the case of an adiabatic region, when the vibrating arm extends in the Y direction in the crystal Z plate and bends and vibrates in the X direction, it is preferable that W1≥12.8 µm be satisfied. When the vibrating arm extends in the X direction in the crystal Z plate and bends and vibrates in the Y direction, it is preferable that W1≥14.4 µm be satisfied. When the vibrating arm extends in the Y direction in the crystal X plate and bends and vibrates in the Z direction, it is preferable that W1≥15.9 µm be satisfied. In this case, since an adiabatic region can be reliably obtained, thermoelastic loss is reduced by the formation of a groove, and the Q value is improved. In addition, due to driving in a region where a groove is formed, the electric field efficiency is high, and the driving area is secured. Accordingly, the CI value is reduced.

Next, on the basis of a simulation result, it will be proved that the above-described effect can be exhibited by satisfying the relationship of 1.2%<H/L<30.0% and the relationship of 1.5≤W2/W1≤10.0. This simulation was performed using one vibrating arm 5. In addition, the vibrating arm 5 used in this simulation is formed of a crystal Z plate (rotation angle of 0°). In this simulation, as the size of the vibrating arm 5, as shown in FIG. 6, the total length L is 1210 µm and the thickness D is 100 the width W1 of the arm portion 51 is 98 µm, the width W2 of the hammerhead 59 is 172 µm, the depths D1 and D2 of the grooves 52 and 53 are 45 µm, and the width W3 of each of the bank portions 511a and 512a is 6.5 µm. Simulation was performed while changing the length H of the hammerhead 59 of the vibrating arm 5. In addition, the present inventors confirmed that a result similar to the simulation result shown below was obtained even if the size (L, W1, W2, D, D1, D2, and W3) of the vibrating arm 5 was changed.

The following Table 1 is a table indicating a CI value change when the length H of the hammerhead 59 is changed.

In addition, in this simulation, the CI value of each sample is calculated as follows. First, the Q value when only the thermoelastic loss is considered is calculated using the finite element method. Then, since the Q value is frequency-dependent, the calculated Q value is converted into the Q value at the time of 32.768 kHz (Q value after F conversion). Then, R1 (CI value) is calculated on the basis of the Q value after F conversion. Then, since the CI value is also frequency-dependent, the calculated R1 is converted into R1 at the time of 32.768 kHz and the reciprocal is taken as a "low R1 index". The low R1 index is an index when a reciprocal, which is the greatest in all simulations, is set to 1. Therefore, as the low R1 index becomes close to 1, the CI value decreases. FIG. 8A shows a graph in which the hammerhead occupancy (H/L) is plotted on the horizontal axis and the low R1 index is plotted on the vertical axis, and FIG. 8B shows a graph obtained by enlarging a part of FIG. 8A.

In addition, a method of converting the Q value to the Q value after F conversion is as follows.

The following calculation was performed using the following Expressions (3) and (4).

$$f_0 = \pi k/(2\rho C p a^2) \quad (3)$$

$$Q = \{\rho Cp/(C\alpha^2 H)\} \times [\{1+(f/f_0)^2\}/(f/f_0)] \quad (4)$$

In Expressions (3) and (4), $\pi$ is the circumference ratio, k is the thermal conductivity of the vibrating arm 5 in the width direction, $\rho$ is a mass density, Cp is a heat capacity, C is an elastic stiffness constant of expansion and contraction in the length direction of the vibrating arm 5, $\alpha$ is a thermal expansion coefficient of the vibrating arm 5 in the length direction, H is an absolute temperature, and f is a natural frequency. In addition, a is a width (effective width) when the vibrating arm 5 is regarded as a flat plate shape shown in FIG. 7. In addition, although the grooves 52 and 53 are not formed in the vibrating arm 5 in FIG. 7, it is possible to perform conversion into the Q value after F conversion even if the value of "a" in this case is used.

First, the natural frequency of the vibrating arm 5 used in the simulation is set to F1 and the calculated Q value is set to Q1, and the value of "a" satisfying f=F1 and Q=Q1 is calculated using Expressions (3) and (4). Then, using the calculated "a" and f=32.768 kHz, the value of Q is calculated from Expression (2). The Q value obtained in this manner is the Q value after F conversion.

TABLE 1

|  | H/L | Natural frequency F1 [Hz] | Q1 | Q value after F conversion | R1 [Ω] | 1/R1 | Low R1 index |
|---|---|---|---|---|---|---|---|
| SIM001 | 0.6% | 7.38E+04 | 159.398 | 76.483 | 3.50E+03 | 1.270E−04 | 0.861 |
| SIM002 | 3.3% | 5.79E+04 | 135.317 | 76.606 | 4.15E+03 | 1.363E−04 | 0.923 |
| SIM003 | 6.0% | 4.99E+04 | 120.906 | 79.442 | 4.58E+03 | 1.435E−04 | 0.972 |
| SIM004 | 8.6% | 4.48E+04 | 111.046 | 81.157 | 4.98E+03 | 1.467E−04 | 0.994 |
| SIM005 | 11.2% | 4.13E+04 | 103.743 | 82.223 | 5.37E+03 | 1.476E−04 | 1.000 |
| SIM006 | 13.9% | 3.88E+04 | 98.038 | 82.843 | 5.74E+03 | 1.471E−04 | 0.997 |
| SIM007 | 16.5% | 3.68E+04 | 93.507 | 83.225 | 6.10E+03 | 1.458E−04 | 0.988 |
| SIM008 | 19.8% | 3.49E+04 | 88.856 | 83.328 | 6.56E+03 | 1.430E−04 | 0.969 |
| SIM009 | 23.1% | 3.35E+04 | 85.017 | 83.115 | 7.02E+03 | 1.393E−04 | 0.944 |
| SIM010 | 26.4% | 3.24E+04 | 81.772 | 82.657 | 7.50E+03 | 1.348E−04 | 0.914 |
| SIM011 | 29.8% | 3.16E+04 | 78.811 | 81.824 | 8.01E+03 | 1.296E−04 | 0.878 |
| SIM012 | 33.1% | 3.09E+04 | 76.247 | 80.864 | 8.56E+03 | 1.239E−04 | 0.839 |
| SIM013 | 36.4% | 3.04E+04 | 73.813 | 79.591 | 9.17E+03 | 1.176E−04 | 0.796 |
| SIM014 | 39.7% | 3.00E+04 | 71.409 | 77.963 | 9.87E+03 | 1.106E−04 | 0.749 |
| SIM015 | 43.0% | 2.98E+04 | 69.077 | 76.078 | 1.07E+04 | 1.032E−04 | 0.699 |
| SIM016 | 46.3% | 2.96E+04 | 66.818 | 73.978 | 1.16E+04 | 9.557E−05 | 0.648 |
| SIM017 | 49.6% | 2.95E+04 | 64.449 | 71.494 | 1.27E+04 | 8.750E−05 | 0.593 |
| SIM018 | 52.9% | 2.96E+04 | 62.042 | 68.733 | 1.40E+04 | 7.928E−05 | 0.537 |
| SIM019 | 56.2% | 2.97E+04 | 59.670 | 65.800 | 1.55E+04 | 7.104E−05 | 0.481 |

TABLE 1-continued

| | H/L | Natural frequency F1 [Hz] | Q1 | Q value after F conversion | R1 [Ω] | 1/R1 | Low R1 index |
|---|---|---|---|---|---|---|---|
| SIM020 | 59.5% | 3.00E+04 | 57.018 | 62.370 | 1.75E+04 | 6.257E−05 | 0.424 |
| SIM021 | 62.8% | 3.03E+04 | 54.502 | 58.918 | 1.98E+04 | 5.447E−05 | 0.369 |
| SIM022 | 66.1% | 3.08E+04 | 51.676 | 54.983 | 2.29E+04 | 4.640E−05 | 0.314 |
| SIM023 | 69.4% | 3.14E+04 | 48.788 | 50.857 | 2.69E+04 | 3.871E−05 | 0.262 |
| SIM024 | 72.7% | 3.23E+04 | 45.699 | 46.416 | 3.23E+04 | 3.140E−05 | 0.213 |
| SIM025 | 76.0% | 3.33E+04 | 42.398 | 41.687 | 4.00E+04 | 2.461E−05 | 0.167 |
| SIM026 | 79.3% | 3.47E+04 | 39.084 | 36.902 | 5.08E+04 | 1.857E−05 | 0.126 |
| SIM027 | 82.6% | 3.65E+04 | 35.523 | 31.872 | 6.77E+04 | 1.325E−05 | 0.090 |
| SIM028 | 85.5% | 3.86E+04 | 32.226 | 27.387 | 9.12E+04 | 9.314E−06 | 0.063 |
| SIM029 | 88.3% | 4.13E+04 | 28.763 | 22.842 | 1.31E+05 | 6.056E−06 | 0.041 |
| SIM030 | 91.1% | 4.50E+04 | 24.918 | 18.132 | 2.11E+05 | 3.448E−06 | 0.023 |
| SIM031 | 93.9% | 5.07E+04 | 21.042 | 13.614 | 4.04E+05 | 1.602E−06 | 0.011 |

The present inventors require the resonator element 2 having the low R1 index of 0.87 or more. As can be seen from Table 1 and the graphs of FIGS. 8A and 8B, the low R1 index is equal to or greater than a target of 0.87 if the relationship of 1.2%<H/L<30.0% is satisfied (SIM002 to SIM011). In particular, if the relationship of 4.6%<H/L<22.3% is satisfied (SIM003 to SIM008), the low R1 index exceeds 0.95. Therefore, it can be seen that the CI value is further reduced. From the above simulation result, it was proved that the resonator element 2 having a sufficiently reduced CI value was obtained by satisfying the relationship of 1.2%<H/L<30.0%.

Second Embodiment

Next, a resonator element according to a second embodiment of the invention will be described.

Figure 9:
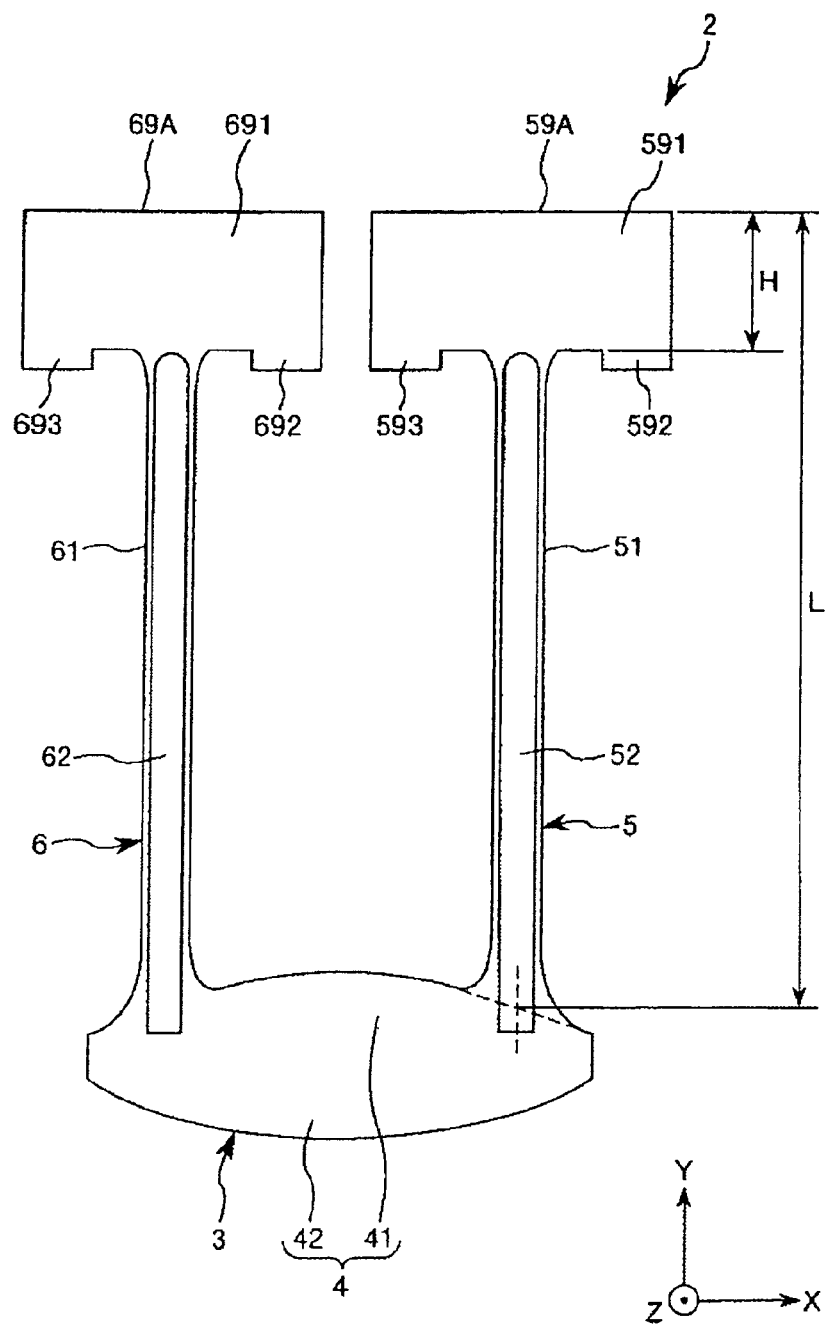
FIG. 9 is a plan view of a resonator element according to a second embodiment of the invention.

FIG. 9 is a plan view of the resonator element according to the second embodiment of the invention.

Hereinafter, the resonator element of the second embodiment will be described focusing on the differences from the first embodiment described above, and explanation of the same matters will be omitted.

The resonator element according to the second embodiment of the invention is the same as that of the first embodiment described above except that the configuration of a hammerhead is different. In addition, the same components as in the first embodiment described above are denoted by the same reference numerals.

As shown in FIG. 9, a hammerhead 59A includes a main body 591 connected to the distal end of an arm portion 51 and protruding portions 592 and 593 that protrude toward the proximal side of a vibrating arm 5 from the main body 591. That is, the hammerhead 59A is formed by omitting the thin portions 594 and 595 from the hammerhead 59 of the first embodiment described above. By forming the hammerhead 59A in such a configuration, it is possible to increase the mass of the hammerhead 59A while suppressing the total length L of the vibrating arm 5. In other words, when the total length L of the vibrating arm 5 is fixed, it is possible to ensure that the arm portion 51 is as long as possible without reducing the mass effect of the hammerhead 59A. Therefore, it is possible to increase the width (length in the X-axis direction) of the vibrating arm 5 in order to obtain a desired resonance frequency (for example, 32.768 kHz). As a result, since the heat transfer path described above becomes long, thermoelastic loss is reduced and the Q value is improved. Here, as shown in FIG. 9, the length H of the hammerhead 59A is from a connecting portion between the hammerhead 59A and the arm portion 51 to the free end, and the length of the protruding portion 592 or 593 is not included in the length H. In addition, the free end portion of the arm portion 51 has a tapered shape whose width increases gradually toward the free end. When the arm portion 51 has a portion in which the width (length in the X-axis direction) of the tapered portion is 1.5 times or more of the width (length in the X-axis direction) of the arm portion 51, this portion is also included in the length H.

Since the hammerhead 69A has the same configuration as the hammerhead 59A described above, explanation thereof will be omitted.

Also in the second embodiment, the same effects as in the first embodiment described above can be achieved.

Third Embodiment

Next, a resonator element according to a third embodiment of the invention will be described.

Figure 10:
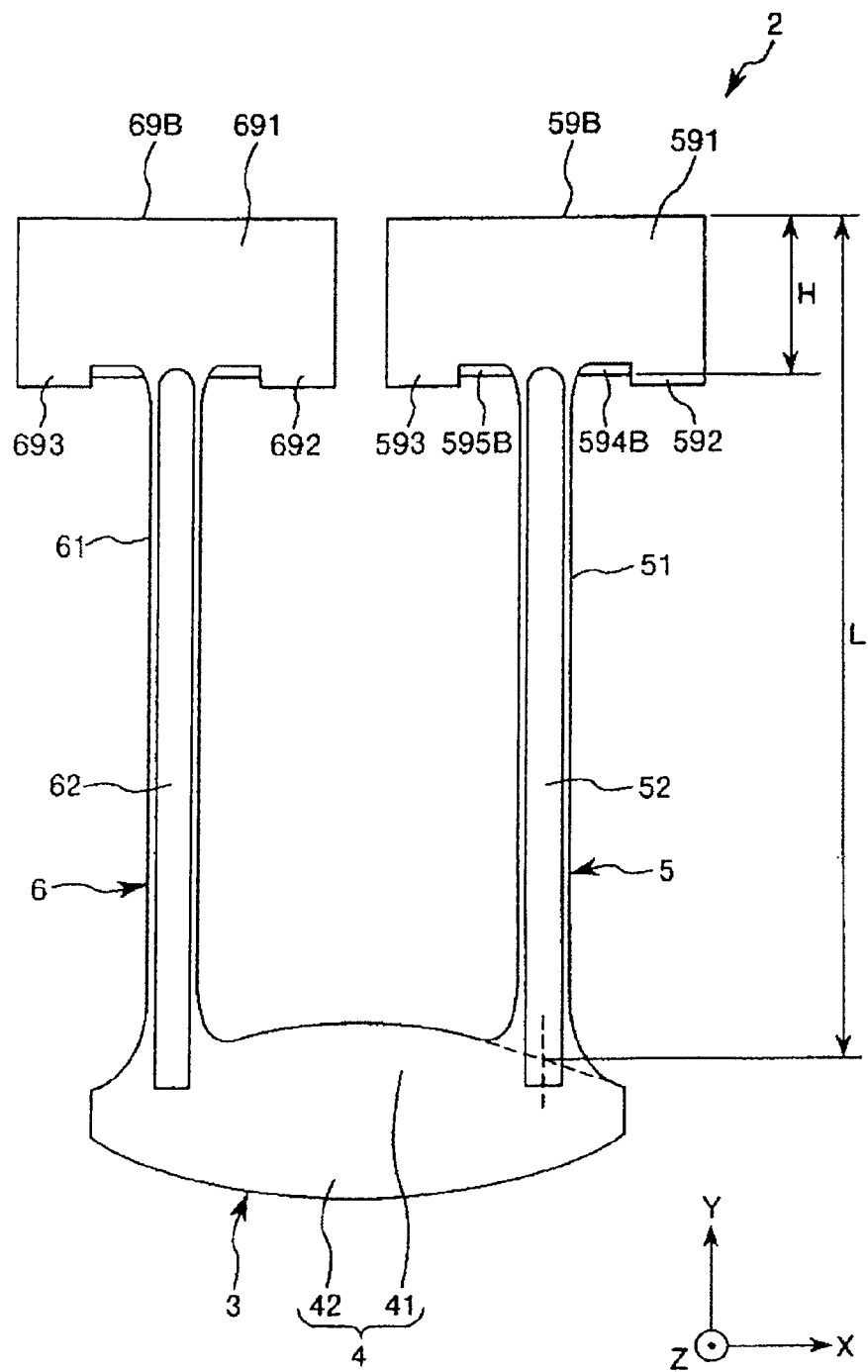
FIG. 10 is a plan view of a resonator element according to a third embodiment of the invention.

FIG. 10 is a plan view of the resonator element according to the third embodiment of the invention.

Hereinafter, the resonator element of the third embodiment will be described focusing on the differences from the first embodiment described above, and explanation of the same matters will be omitted.

The resonator element according to the third embodiment of the invention is the same as that of the first embodiment described above except that the configuration of a hammerhead is different. In addition, the same components as in the first embodiment described above are denoted by the same reference numerals.

As shown in FIG. 10, in a hammerhead 59B, thin portions 594B and 595B are shorter than the protruding portions 592 and 593, and only portions of the protruding portions 592 and 593 on the fixed end side are connected to the arm portion 51 through the thin portions 594B and 595B. By forming the hammerhead 59B in such a configuration, it is possible to increase the mass of the hammerhead 59B while suppressing the total length L of the vibrating arm 5. In other words, when the total length L of the vibrating arm 5 is fixed, it is possible to ensure that the arm portion 51 is as long as possible without reducing the mass effect of the hammerhead 59B. Therefore, it is possible to increase the width (length in the X-axis direction) of the vibrating arm 5 in order to obtain a desired resonance frequency (for example, 32.768 kHz). As a result, since the heat transfer path described above becomes long, thermoelastic loss is reduced and the Q value is improved. Here, as shown in FIG. 10, the length H of the hammerhead 59B is from a connecting portion between each of the thin portions 594B and 595B and the arm portion 51 to the free end, and the length of a free end portion of each of the protruding portions 592 and 593 is not included in the length H. In addition, the free end portion of the arm portion 51 has a tapered shape whose width increases gradually toward the free end. When the arm portion 51 has a portion in which the width (length in the X-axis direction) of the tapered portion is 1.5 times or more of the width (length in the X-axis direction) of the arm portion 51, this portion is also included in the length H.

Since the hammerhead 69B has the same configuration as the hammerhead 59B described above, explanation thereof will be omitted.

Also in the third embodiment, the same effects as in the first embodiment described above can be achieved.

Fourth Embodiment

Next, a resonator element according to a fourth embodiment of the invention will be described.

Figure 11:
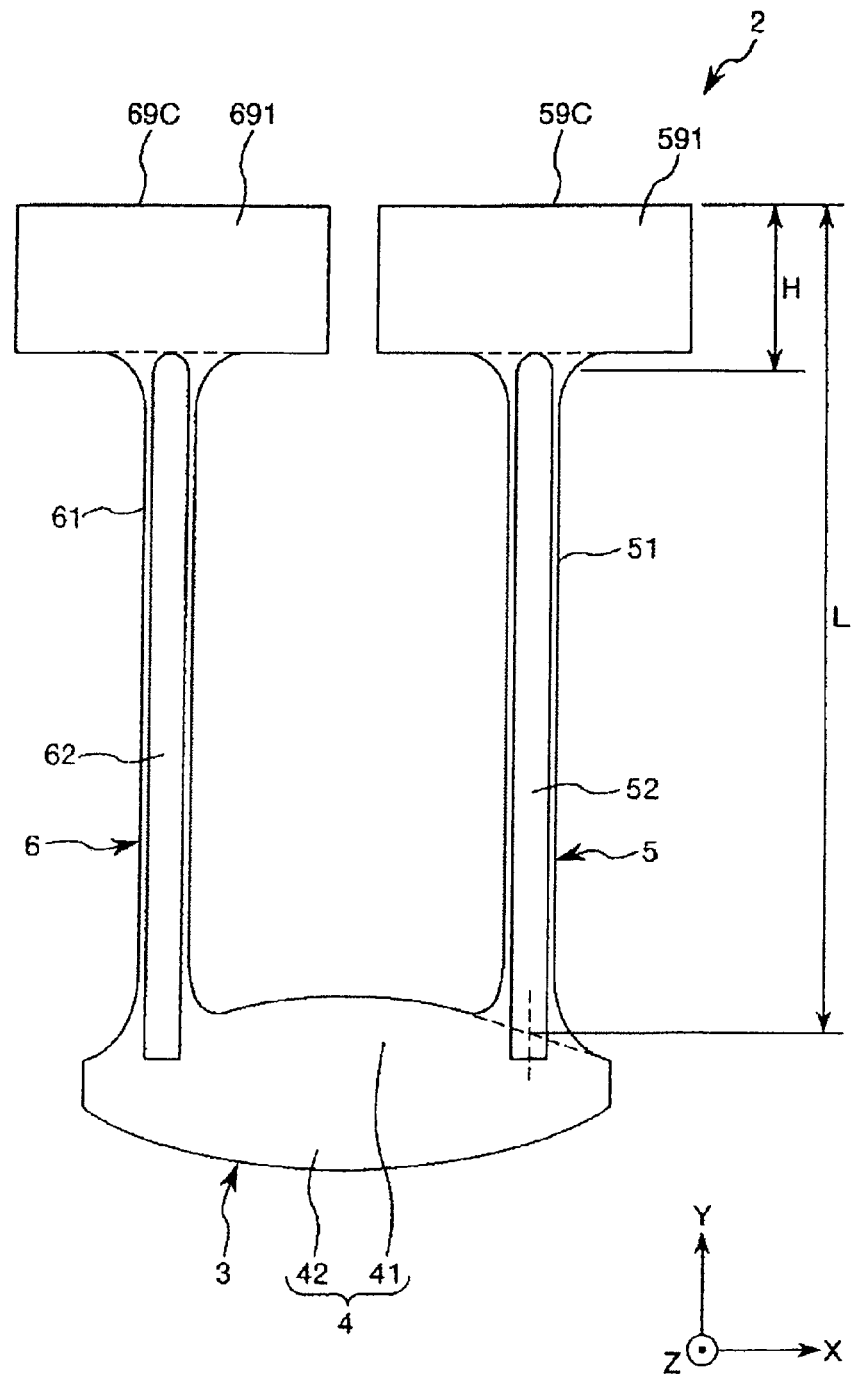
FIG. 11 is a plan view of a resonator element according to a fourth embodiment of the invention.

FIG. 11 is a plan view of the resonator element according to the fourth embodiment of the invention.

Hereinafter, the resonator element of the fourth embodiment will be described focusing on the differences from the first embodiment described above, and explanation of the same matters will be omitted.

The resonator element according to the fourth embodiment of the invention is the same as that of the first embodiment described above except that the configuration of a hammerhead is different. In addition, the same components as in the first embodiment described above are denoted by the same reference numerals.

As shown in FIG. 11, a hammerhead 59C has an approximately rectangular shape, and is formed by omitting the protruding portions 592 and 593 and the thin portions 594 and 595 from the hammerhead of the first embodiment described above. By adopting such a configuration, the configuration of the hammerhead 59C becomes simple. In addition, the distal end of each of the grooves 52 and 53 is located in a boundary of the arm portion 51 and the hammerhead 59C. The free end portion of the arm portion 51 has a tapered shape whose width increases gradually toward the free end. When the arm portion 51 has a portion in which the width (length in the X-axis direction) of the tapered portion is 1.5 times or more of the width (length in the X-axis direction) of the arm portion 51, this portion is also included in the length H of the hammerhead 59C.

Since the hammerhead 69C has the same configuration as the hammerhead 59C described above, explanation thereof will be omitted.

Also in the fourth embodiment, the same effects as in the first embodiment described above can be achieved.

Fifth Embodiment

Next, a resonator element according to a fifth embodiment of the invention will be described.

Figure 12:
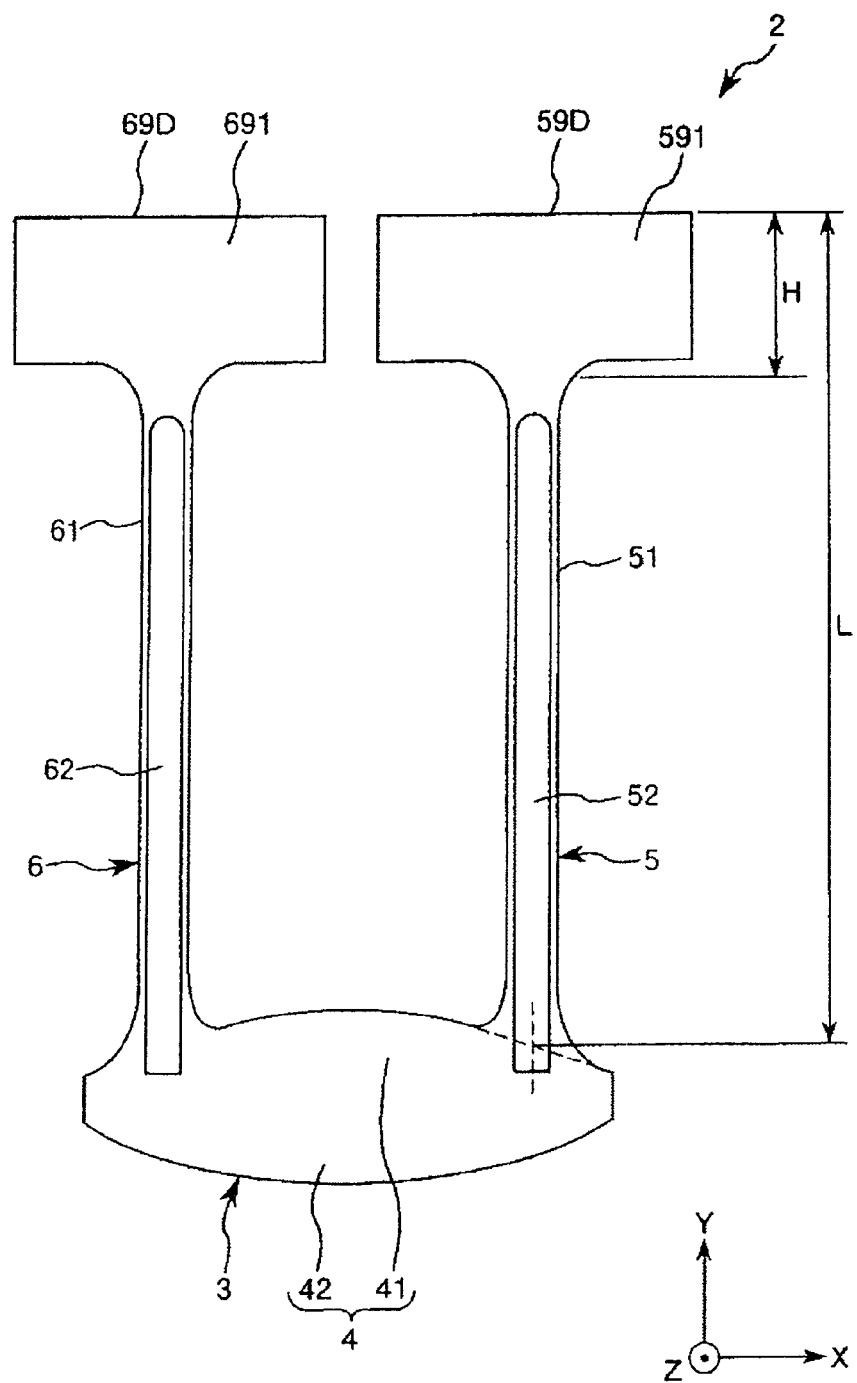
FIG. 12 is a plan view of a resonator element according to a fifth embodiment of the invention.

FIG. 12 is a plan view of the resonator element according to the fifth embodiment of the invention.

Hereinafter, the resonator element of the fifth embodiment will be described focusing on the differences from the first embodiment described above, and explanation of the same matters will be omitted.

The resonator element according to the fifth embodiment of the invention is the same as that of the first embodiment described above except that the configuration of a hammerhead is different. In addition, the same components as in the first embodiment described above are denoted by the same reference numerals.

As shown in FIG. 12, a hammerhead 59D has an approximately rectangular shape, and is formed by omitting the protruding portions 592 and 593 and the thin portions 594 and 595 from the hammerhead of the first embodiment described above. By adopting such a configuration, the configuration of the hammerhead 59D becomes simple. The free end portion of the arm portion 51 has a tapered shape whose width increases gradually toward the free end. When the arm portion 51 has a portion in which the width (length in the X-axis direction) of the tapered portion is 1.5 times or more of the width (length in the X-axis direction) of the arm portion 51, this portion is also included in the length H of the hammerhead 59D.

Since the hammerhead 69D has the same configuration as the hammerhead 59D described above, explanation thereof will be omitted.

Also in the fifth embodiment, the same effects as in the first embodiment described above can be achieved.

Sixth Embodiment

Next, a resonator element according to a sixth embodiment of the invention will be described.

Figure 13:
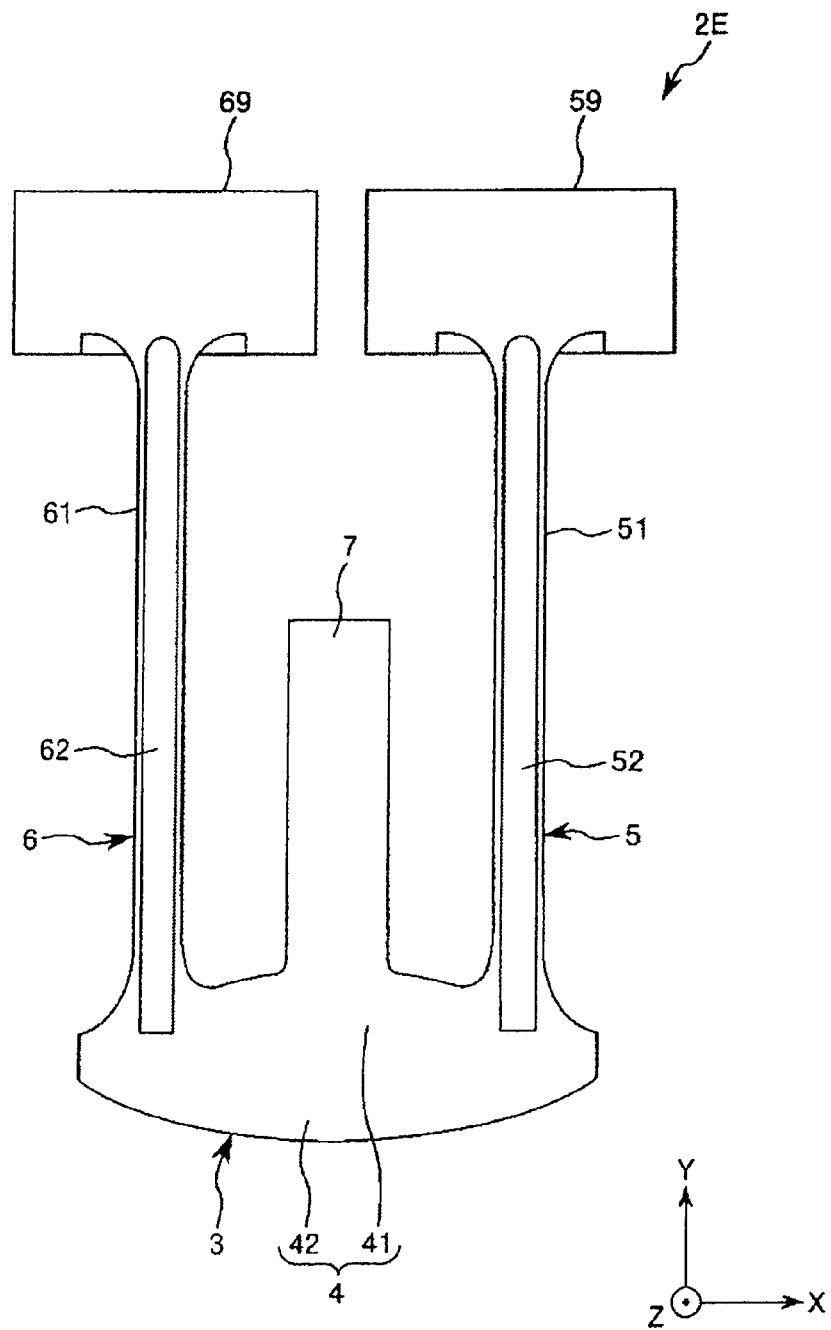
FIG. 13 is a plan view of a resonator element according to a sixth embodiment of the invention.

FIG. 13 is a plan view of the resonator element according to the sixth embodiment of the invention.

Hereinafter, the resonator element of the sixth embodiment will be described focusing on the differences from the first embodiment described above, and explanation of the same matters will be omitted.

The resonator element according to the sixth embodiment of the invention is the same as that of the first embodiment described above except that a support portion is further provided. In addition, the same components as in the first embodiment described above are denoted by the same reference numerals.

As shown in FIG. 13, a resonator element 2E is located between vibrating arms 5 and 6, and includes a support portion 7 that extends in the Y-axis direction from the base portion 4. Although not shown, the resonator element 2E is fixed to the package through an adhesive by the support portion 7. By adopting such a configuration, it is possible to more effectively reduce the vibration leakage of the resonator element 2E.

Also in the sixth embodiment, the same effects as in the first embodiment described above can be achieved.

Seventh Embodiment

Next, a resonator element according to a seventh embodiment of the invention will be described.

Figure 14:
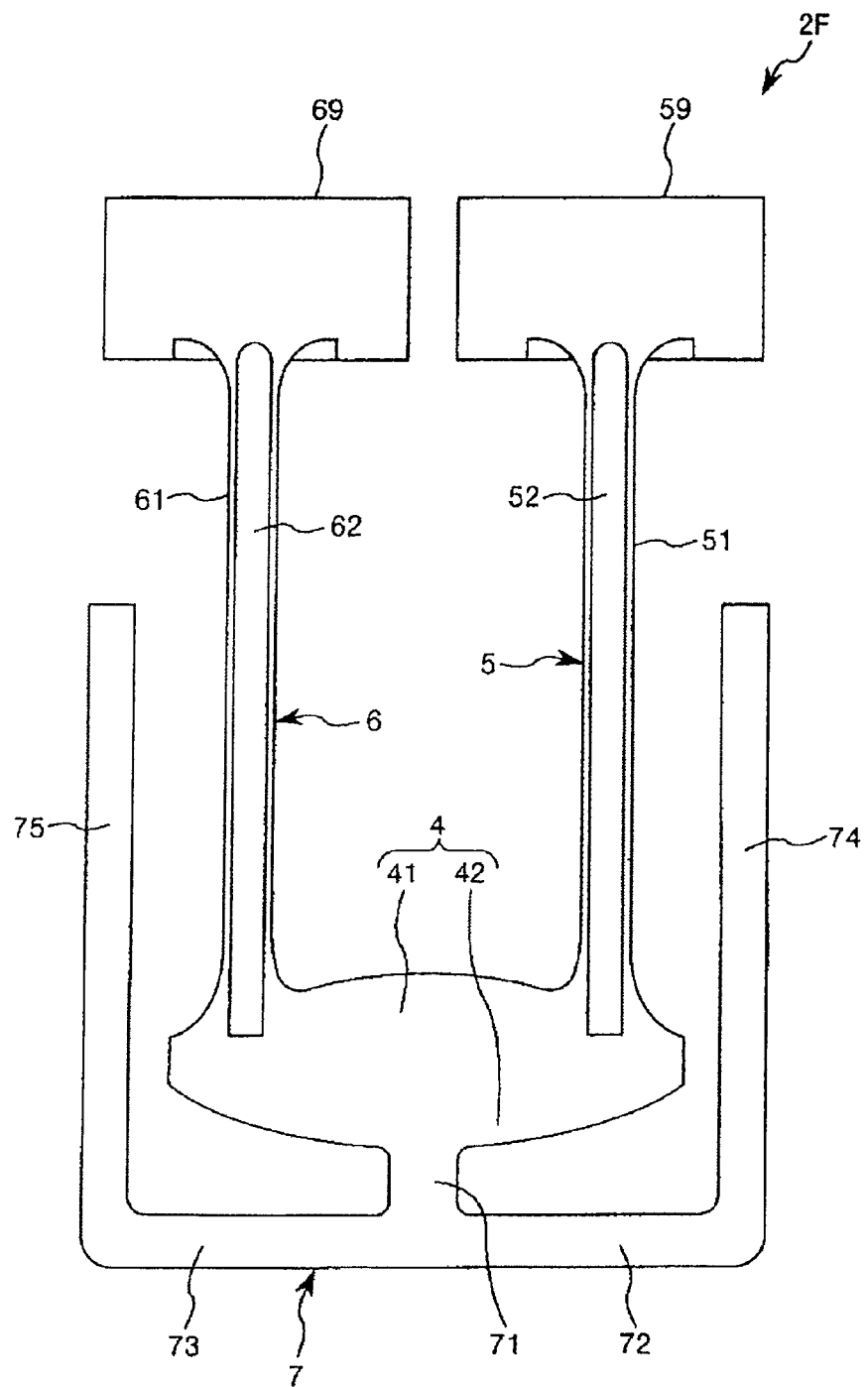
FIG. 14 is a plan view of a resonator element according to a seventh embodiment of the invention.

FIG. 14 is a plan view of the resonator element according to the seventh embodiment of the invention.

Hereinafter, the resonator element of the seventh embodiment will be described focusing on the differences from the first embodiment described above, and explanation of the same matters will be omitted.

The resonator element according to the seventh embodiment of the invention is the same as that of the first embodiment described above except that a support portion is further provided. In addition, the same components as in the first embodiment described above are denoted by the same reference numerals.

As shown in FIG. 14, a resonator element 2F includes a support portion 7 extending from a base portion 4. The support portion 7 includes a branch portion 71 that extends from the lower end (side opposite to a side where the vibrating arms 5 and 6 extend) of the base portion 4 and is branched in the X-axis direction, connecting arms 72 and 73 extending from the branch portion to both sides in the X-axis direction, and support arms 74 and 75 extending from the distal ends of the connecting arms 72 and 73 to the vibrating arms 5 and 6 in the Y-axis direction. In addition, the support arms 74 and 75 are disposed so as to face each other in the X-axis direction with the vibrating arms 5 and 6 interposed therebetween. Although not shown, the resonator element 2F is fixed to the package through an adhesive or the like by the support arms 74 and 75. By adopting such a configuration, it is possible to more effectively reduce the vibration leakage of the resonator element 2F.

Also in the seventh embodiment, the same effects as in the first embodiment described above can be achieved.

2. Resonator

Next, a resonator according to the invention will be described.

Figure 15:
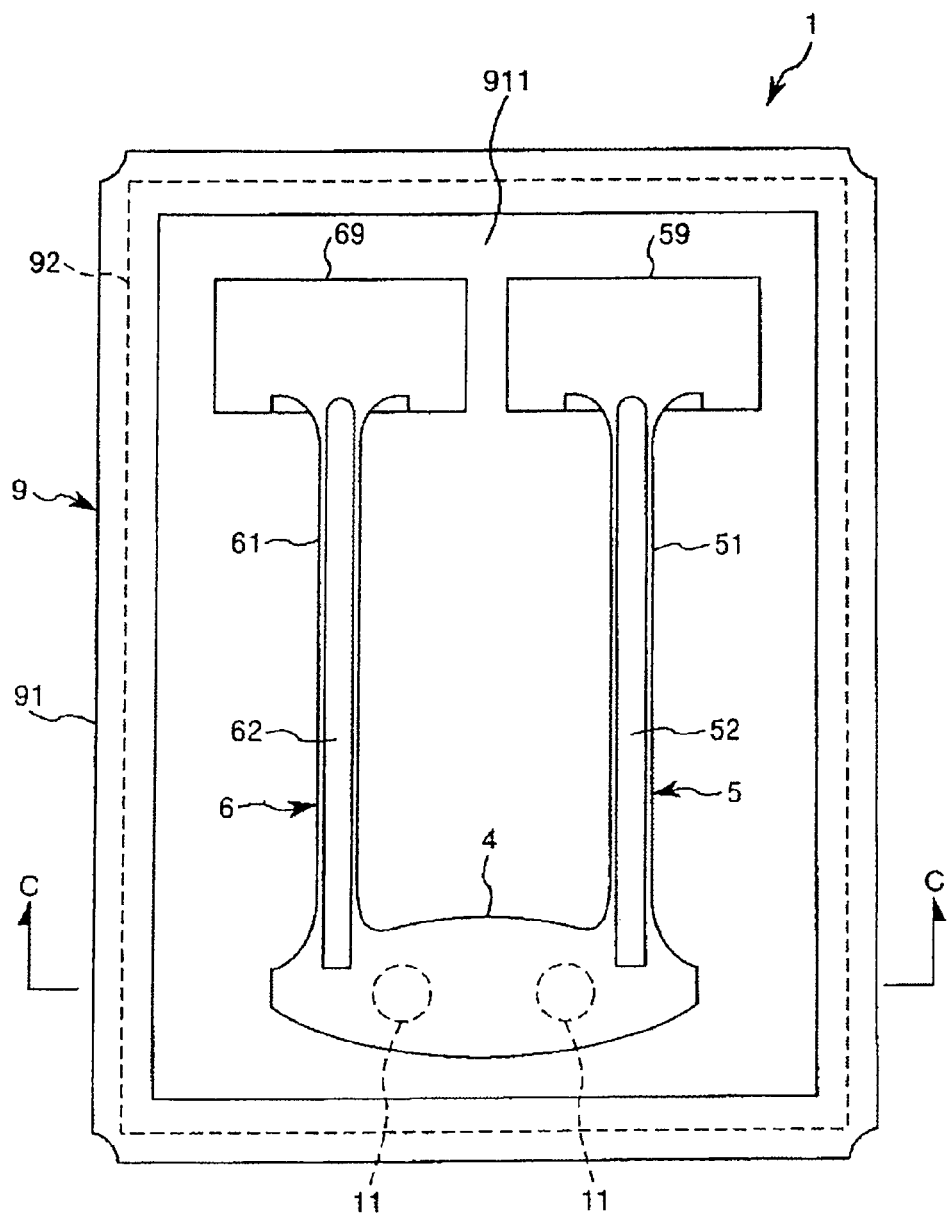
FIG. 15 is a plan view showing a resonator according to a preferred embodiment of the invention.
Figure 16:
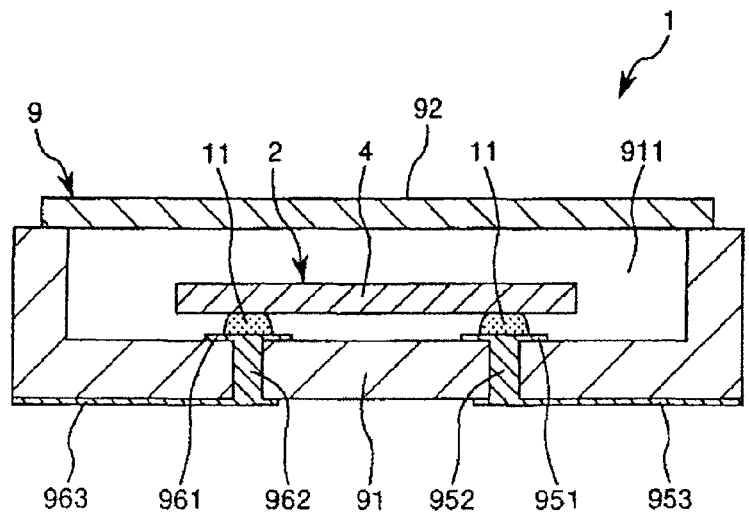
FIG. 16 is a cross-sectional view taken along the line C-C of FIG. 15.

FIG. 15 is a plan view showing a resonator according to a preferred embodiment of the invention, and FIG. 16 is a cross-sectional view taken along the line C-C of FIG. 15.

As shown in FIG. 15, a resonator 1 includes the resonator element 2 (resonator element according to the invention) and a package 9 in which the resonator element 2 is housed. In addition, the resonator element 2 is the same as the resonator element described in the first embodiment.

The package 9 includes a box-shaped base 91 having a recess 911, which is opened on the top surface, and a plate-shaped lid 92 bonded to the base 91 so as to close the opening of the recess 911. The package 9 has a storage space formed by closing the recess 911 with the lid 92, and the resonator element 2 is housed in the storage space in an airtight manner. The resonator element 2 is fixed to the bottom surface of the recess 911 through a conductive adhesive 11, which is formed by mixing a conductive filler in an epoxy-based or acrylic resin, for example, in the base portion 4. The storage space may be in a decompressed (preferably, vacuum) state, or inert gas, such as nitrogen, helium, and argon, may fill the storage space. In this case, the vibration characteristics of the resonator element 2 are improved.

Materials of the base 91 are not limited in particular, and various ceramics, such as aluminum oxide, can be used. In addition, although materials of the lid 92 are not limited in particular, it is preferable to use a member having a linear expansion coefficient similar to that of the material of the base 91. For example, when the above-described ceramic is used as a material of the base 91, it is preferable to use an alloy, such as Kovar. In addition, bonding of the base 91 and the lid 92 is not limited in particular. For example, the base 91 and the lid 92 may be bonded to each other through an adhesive or may be bonded to each other by seam welding or the like.

In addition, connecting terminals 951 and 961 are formed on the bottom surface of the recess 911 of the base 91. Although not shown, the first driving electrode 84 of the resonator element 2 is electrically connected to the connecting terminal 951 through a conductive adhesive 11 in the base portion 4. Similarly, although not shown, the second driving electrode 85 of the resonator element 2 is electrically connected to the connecting terminal 961 through the conductive adhesive 11 in the base portion 4.

In addition, the connecting terminal 951 is electrically connected to an external terminal 953, which is formed on the bottom surface of the base 91, through a penetrating electrode 952 passing through the base 91, and the connecting terminal 961 is electrically connected to an external terminal 963, which is formed on the bottom surface of the base 91, through a penetrating electrode 962 passing through the base 91.

Materials of the connecting terminals 951 and 961, the penetrating electrodes 952 and 962, and the external terminals 953 and 963 are not limited in particular as long as the materials are electrically conductive. For example, the connecting terminals 951 and 961, the penetrating electrodes 952 and 962, and the external terminals 953 and 963 may be formed of a metal coat that is formed by laminating a coat, such as Ni (nickel), Au (gold), Ag (silver), or Cu (copper), on a metalized layer (base layer), such as Cr (chromium) or W (tungsten).

3. Oscillator

Next, an oscillator to which the resonator element according to the invention is applied (oscillator according to the invention) will be described.

Figure 17:
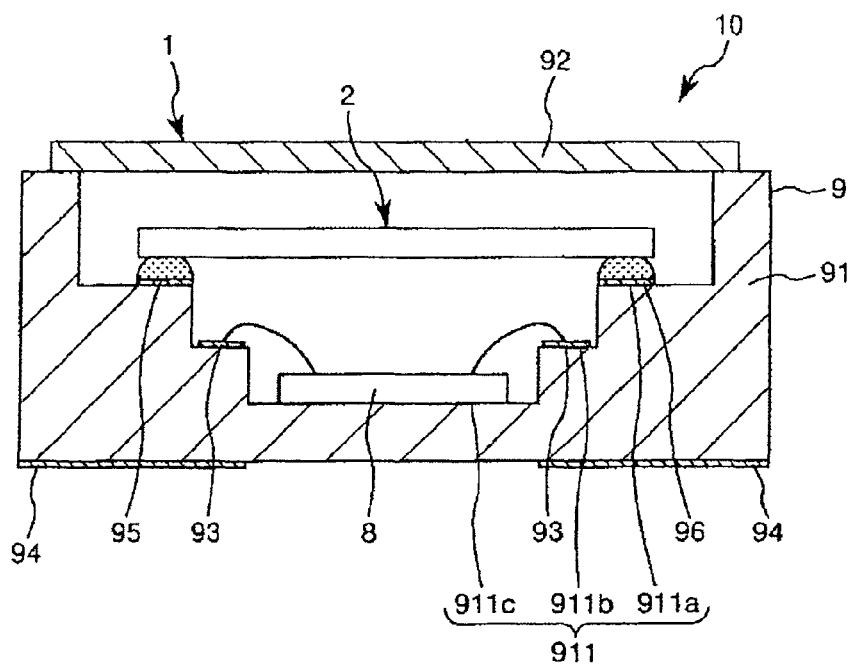
FIG. 17 is a cross-sectional view showing an oscillator according to a preferred embodiment of the invention.

FIG. 17 is a cross-sectional view showing an oscillator according to a preferred embodiment of the invention.

An oscillator 10 shown in FIG. 17 includes a resonator 1 and an IC chip 8 for driving the resonator element 2. Hereinafter, the oscillator 10 will be described focusing on the differences from the resonator described above, and explanation of the same matters will be omitted.

As shown in FIG. 17, the package 9 includes a box-shaped base 91 having a recess 911 and a plate-shaped lid 92 for closing the opening of the recess 911. In addition, the recess 911 of the base 91 has a first recess 911a opened on the top surface of the base 91, a second recess 911b opened in a middle portion of the bottom surface of the first recess 911a, and a third recess 911c opened in a middle portion of the bottom surface of the second recess 911b.

Connecting terminals 95 and 96 are formed on the bottom surface of the first recess 911a. In addition, the IC chip 8 is disposed on the bottom surface of the third recess 911c. The IC chip 8 includes an oscillation circuit for controlling the driving of the resonator element 2. When the resonator element 2 is driven by the IC chip 8, it is possible to extract a signal of a predetermined frequency.

In addition, a plurality of internal terminals 93 electrically connected to the IC chip 8 through a wire are formed on the bottom surface of the second recess 911b. A terminal electrically connected to an external terminal 94 formed on the bottom surface of the package 9 through a via (not shown) formed in the base 91, a terminal electrically connected to the connecting terminal 95 through a via or a wire (not shown), and a terminal electrically connected to the connecting terminal 96 through a via or a wire (not shown) are included in the plurality of internal terminals 93.

In addition, although the configuration in which the IC chip 8 is disposed in the storage space has been described in the configuration shown in FIG. 17, the arrangement of the IC chip 8 is not limited in particular. For example, the IC chip 8 may be disposed outside the package 9 (disposed on the bottom surface of the base).

4. Electronic Apparatus

Next, an electronic apparatus to which the resonator element according to the invention is applied (electronic apparatus according to the invention) will be described.

Figure 18:
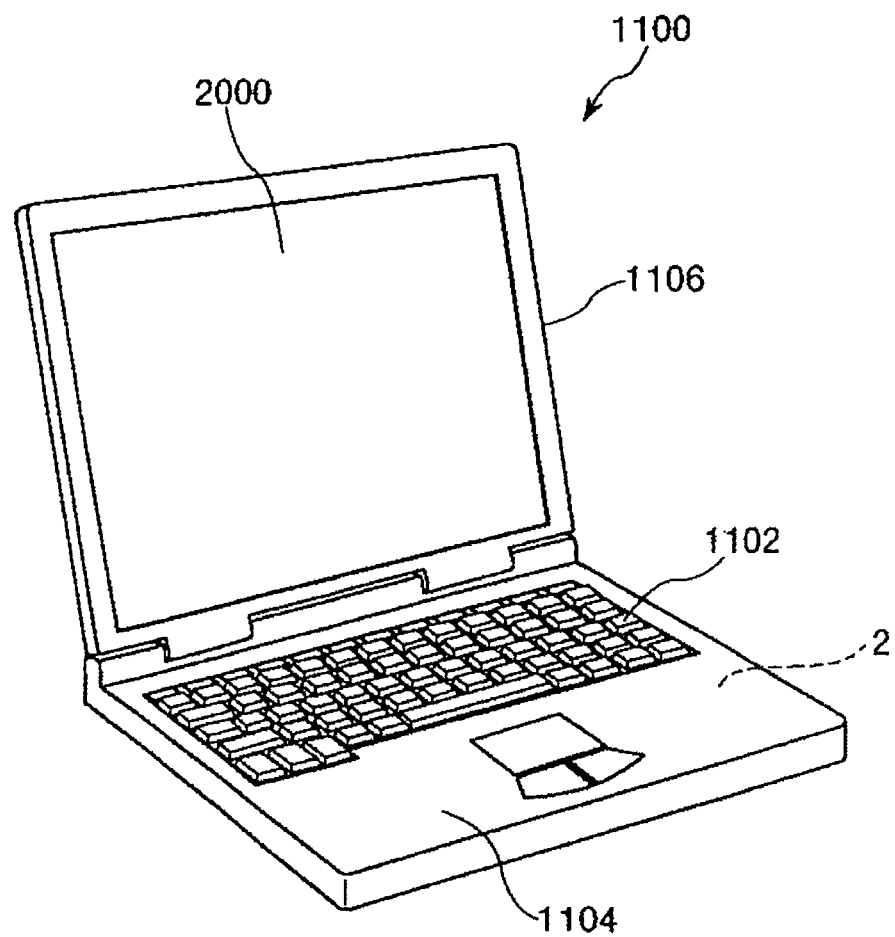
FIG. 18 is a perspective view showing the configuration of a mobile (or notebook) personal computer as an electronic apparatus including the resonator element according to the embodiment of the invention.

FIG. 18 is a perspective view showing the configuration of a mobile (or notebook) personal computer as an electronic apparatus including the resonator element according to the invention. In FIG. 18, a personal computer 1100 is configured to include a main body 1104 having a keyboard 1102 and a display unit 1106 having a display section 2000, and the display unit 1106 is supported so as to be rotatable with respect to the main body 1104 through a hinge structure. The resonator element 2 that functions as a filter, a resonator, a reference clock, and the like is provided in the personal computer 1100.

Figure 19:
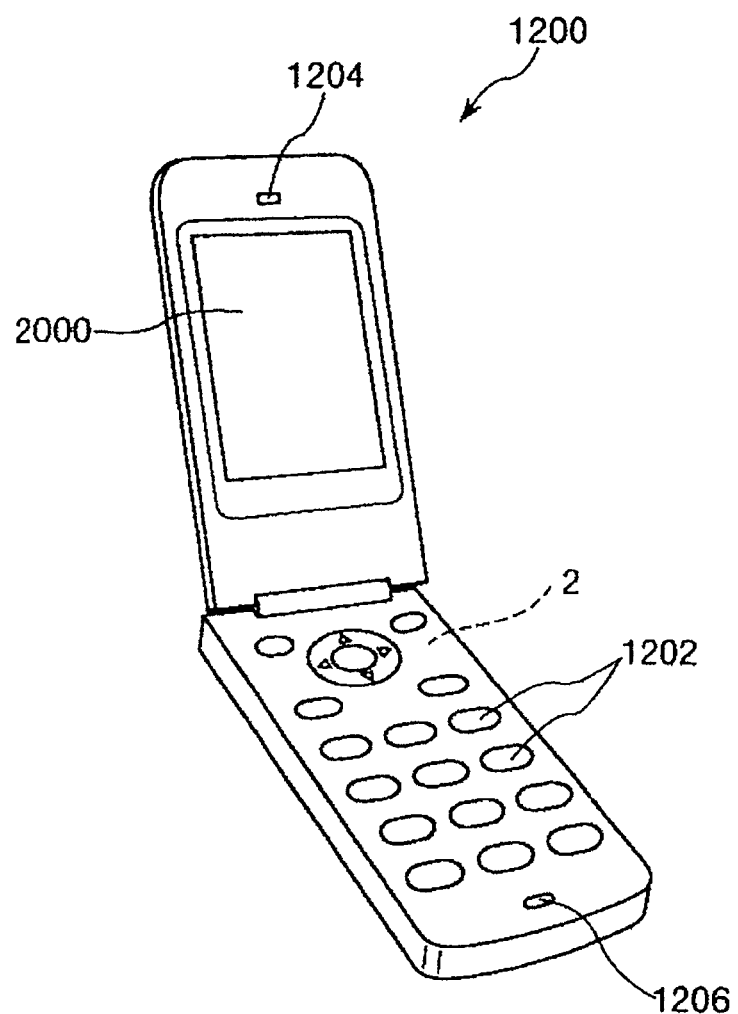
FIG. 19 is a perspective view showing the configuration of a mobile phone (PHS is also included) as an electronic apparatus including the resonator element according to the embodiment of the invention.

FIG. 19 is a perspective view showing the configuration of a mobile phone (PHS is also included) as an electronic apparatus including the resonator element according to the invention. In FIG. 19, a mobile phone 1200 includes a plurality of operation buttons 1202, an earpiece 1204, and a mouthpiece 1206, and a display section 2000 is disposed between the operation buttons 1202 and the earpiece 1204. The resonator element 2 that functions as a filter, a resonator, and the like is built into the mobile phone 1200.

Figure 20:
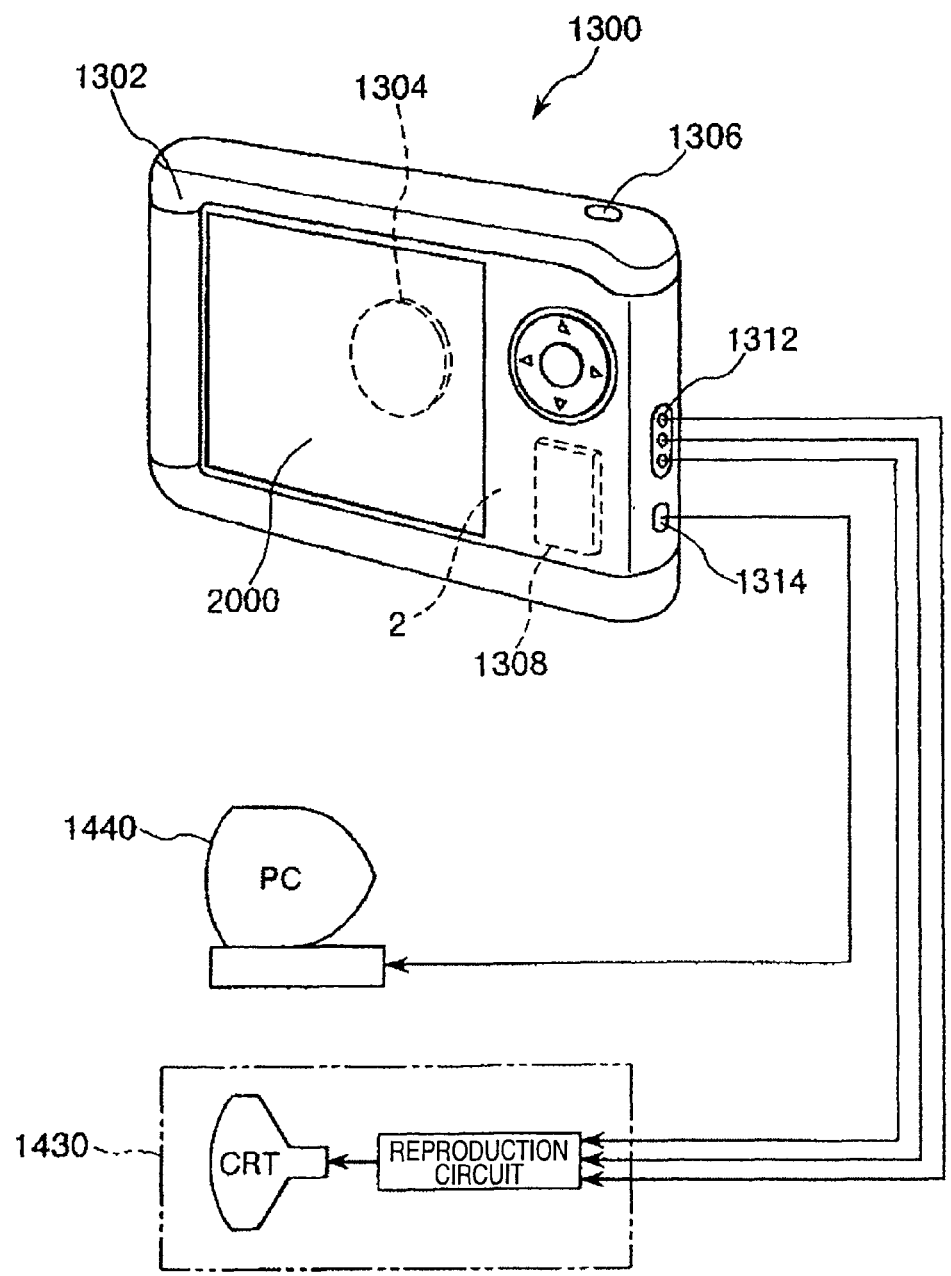
FIG. 20 is a perspective view showing the configuration of a digital still camera as an electronic apparatus including the resonator element according to the embodiment of the invention.

FIG. 20 is a perspective view showing the configuration of a digital still camera as an electronic apparatus including the resonator element according to the invention. In addition, connection with an external device is simply shown in FIG. 20. Here, a silver halide photograph film is exposed to light according to an optical image of a subject in a typical camera, while a digital still camera 1300 generates an imaging signal (image signal) by performing photoelectric conversion of an optical image of a subject using an imaging element, such as a charge coupled device (CCD).

A display unit is provided on the back of a case (body) 1302 in the digital still camera 1300, so that display based on the imaging signal of the CCD is performed. The display unit functions as a viewfinder that displays a subject as an electronic image. In addition, a light receiving unit 1304 including an optical lens (imaging optical system), a CCD, and the like is provided on the front side (back side in FIG. 20) of the case 1302.

When a photographer checks a subject image displayed on the display unit and presses a shutter button 1306, an imaging signal of the CCD at that point in time is transferred and stored in a memory 1308. In addition, in the digital still camera 1300, a video signal output terminal 1312 and an input/output terminal for data communication 1314 are provided on the side surface of the case 1302. In addition, as shown in FIG. 20, a television monitor 1430 is connected to the video signal output terminal 1312 and a personal computer 1440 is connected to the input/output terminal for data communication 1314 when necessary. In addition, an imaging signal stored in the memory 1308 may be output to the television monitor 1430 or the personal computer 1440 by a predetermined operation. The resonator element 2 that functions as a filter, a resonator, and the like is built into the digital still camera 1300.

In addition, the electronic apparatus including the resonator element according to the invention can be applied not only to the personal computer (mobile personal computer) shown in FIG. 18, the mobile phone shown in FIG. 19, and the digital still camera shown in FIG. 20 but also to an ink jet type discharge apparatus (for example, an ink jet printer), a laptop type personal computer, a television, a video camera, a video tape recorder, a car navigation apparatus, a pager, an electronic organizer (an electronic organizer with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, instruments (for example, instruments for vehicles, aircraft, and ships), a flight simulator, and the like.

5. Moving Object

Next, a moving object (moving object according to the invention) to which the resonator element according to the invention is applied will be described.

Figure 21:
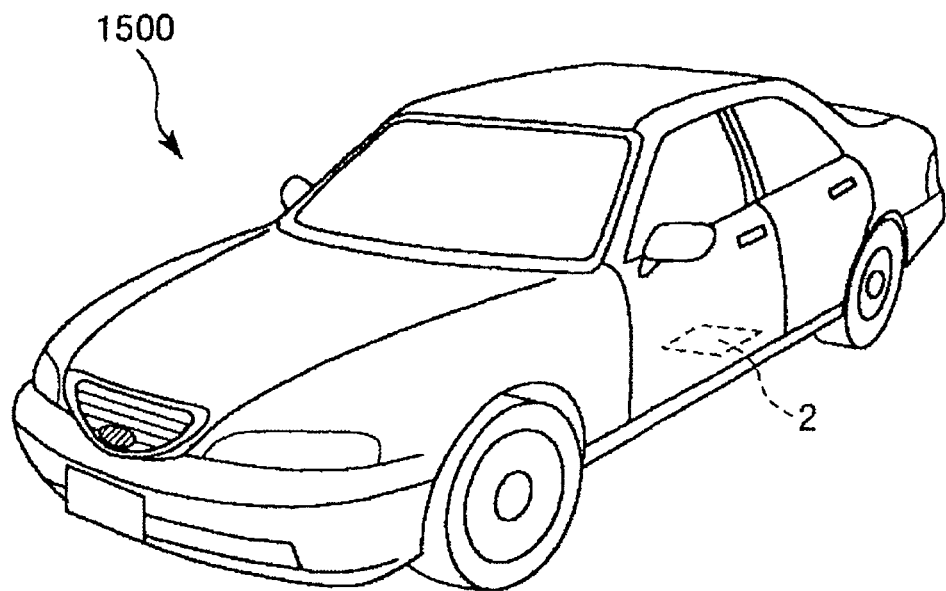
FIG. 21 is a perspective view schematically showing a vehicle as an example of a moving object according to the invention.

FIG. 21 is a perspective view schematically showing a vehicle as an example of the moving object according to the invention. The resonator element 2 is mounted in a vehicle 1500. The resonator element 2 can be widely applied to an electronic control unit (ECU), such as a keyless entry, an immobilizer, a car navigation system, a car air-conditioner, an anti-lock brake system (ABS), an airbag, a tire pressure monitoring system (TPMS), an engine control, a battery monitor of a hybrid vehicle or an electric vehicle, and a vehicle body position control system.

While the resonator element, the resonator, the oscillator, the electronic apparatus, and the moving object according to the invention have been described with reference to the illustrated embodiments, the invention is not limited thereto, and the configuration of each portion may be replaced with an arbitrary configuration having the same function. In addition, other arbitrary structures may be added to the invention. In addition, the embodiments described above may be appropriately combined.

The entire disclosure of Japanese Patent Application No. 2013-052489, filed Mar. 14, 2013 is expressly incorporated by reference herein.

What is claimed is:

1. A resonator element, comprising:
   a base portion; and
   a pair of vibrating arms that extend in a first direction from the base portion in plan view and are aligned along a second direction crossing the first direction in plan view, each of the vibrating arms including:
   an arm portion; and
   a wide portion disposed on a side of the arm portion opposite to the base portion in plan view and having a length along the second direction that is greater than the arm portion in plan view,
   wherein for each vibrating arm:
   a length of the vibrating arm along the first direction is L and a length of the wide portion along the first direction is H,
   a length of the arm portion along the second direction is W1 and a length of the wide portion along the second direction is W2,
   a relationship of $1.5 \leq W2/W1 \leq 10.0$ is satisfied, and
   L and H satisfy a relationship of $4.6\% < H/L < 22.3\%$.

2. The resonator element according to claim 1,
   wherein for each vibrating arm the W1 and the W2 satisfy a relationship of $1.6 \leq W2/W1 \leq 7.0$.

3. The resonator element according to claim 1,
   wherein for each vibrating arm a bottomed groove extending along the first direction is provided on a principal surface of the arm portion.

4. The resonator element according to claim 1,
   wherein for each vibrating arm the wide portion includes a main body, which is connected to a side of the arm portion opposite to the base portion, and a protruding portion, which extends from the main body toward the base portion of the arm portion so as to be spaced apart from the arm portion in plan view.

5. The resonator element according to claim 4,
   wherein for each vibrating arm the wide portion further includes a connecting portion that is located in a region interposed between the protruding portion and the arm portion, connects the protruding portion and the arm portion to each other, and has a length along a third direction perpendicular to the first and second directions that is smaller than the arm portion and the protruding portion.

6. The resonator element according to claim 1,
   wherein the base portion includes a width-decreasing portion, in which a length in the second direction gradually decreases as a distance from the vibrating arm increases, on a side opposite to a side where the vibrating arm extends.

7. The resonator element according to claim 1, further comprising:
   a support portion that is disposed between the pair of vibrating arms and extends from the base portion.

8. The resonator element according to claim 1, further comprising:
   a pair of support arms that are connected to the base portion, the pair of vibrating arms being interposed between the pair of support arms in plan view.

9. A resonator, comprising:
   the resonator element according to claim 1; and
   a package in which the resonator element is housed.

10. A resonator, comprising:
    the resonator element according to claim 2; and
    a package in which the resonator element is housed.

11. An oscillator, comprising:
    the resonator element according to claim 1; and
    an oscillation circuit electrically connected to the resonator element.

12. An oscillator, comprising:
    the resonator element according to claim 2; and
    an oscillation circuit electrically connected to the resonator element.

13. An electronic apparatus, comprising:
    the resonator element according to claim 1.

14. An electronic apparatus, comprising:
    the resonator element according to claim 2.

15. A moving object, comprising:
    the resonator element according to claim 1.

16. A moving object, comprising:
    the resonator element according to claim 2.

17. A resonator element, comprising:
    a base portion; and
    a pair of vibrating arms that extend in a first direction from the base portion in plan view and are aligned along a second direction crossing the first direction in plan view, each of the vibrating arms including:
    an arm portion; and
    a wide portion disposed on a side of the arm portion opposite to the base portion in plan view and having a length along the second direction that is greater than the arm portion in plan view, the wide portion including:
       a main body connected to a side of the arm portion opposite to the base portion;
       a protruding portion extending from the main body toward the base portion of the arm portion so as to be spaced apart from the arm portion in plan view; and
       a connecting portion located in a region interposed between the protruding portion and the arm portion that connects the protruding portion and the arm portion to each other, and has a length along a third direction perpendicular to the first and second directions that is smaller than the arm portion and the protruding portion,
    wherein for each vibrating arm:
       a length of the vibrating arm along the first direction is L and a length of the wide portion along the first direction is H,
       a relationship of $1.2\% < H/L < 30.0\%$ is satisfied,
       a length of the arm portion along the second direction is W1 and a length of the wide portion along the second direction is W2, and
       a relationship of $1.5 \leq W2/W1 \leq 10.0$ is satisfied.

\* \* \* \* \*